(12) United States Patent
Cheng et al.

(10) Patent No.: US 9,324,431 B1
(45) Date of Patent: Apr. 26, 2016

(54) FLOATING GATE MEMORY DEVICE WITH INTERPOLY CHARGE TRAPPING STRUCTURE

(71) Applicant: MACRONIX INTERNATIONAL CO., LTD., Hsinchu (TW)

(72) Inventors: Cheng-Hsien Cheng, Hsinchu (TW); Wen-Jer Tsai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/606,647

(22) Filed: Jan. 27, 2015

(51) Int. Cl.
*G11C 11/34* (2006.01)
*G11C 16/04* (2006.01)
*G11C 16/14* (2006.01)

(52) U.S. Cl.
CPC ........ *G11C 16/0466* (2013.01); *G11C 16/0408* (2013.01); *G11C 16/14* (2013.01)

(58) Field of Classification Search
CPC . G11C 16/0466; G11C 16/0408; G11C 16/14
USPC .......................... 365/185.24, 185.18, 185.26
See application file for complete search history.

(56) References Cited

U.S. PATENT DOCUMENTS

| 8,664,710 | B2 | 3/2014 | Ku et al. | |
|---|---|---|---|---|
| 2006/0140006 | A1* | 6/2006 | Yeh | G11C 16/0416 365/185.21 |
| 2007/0058445 | A1* | 3/2007 | Liao | G11C 16/3404 365/185.29 |
| 2009/0040829 | A1* | 2/2009 | Lue | G11C 11/5621 365/185.13 |
| 2009/0262583 | A1 | 10/2009 | Lue | |
| 2013/0328119 | A1 | 12/2013 | Ku et al. | |

* cited by examiner

*Primary Examiner* — Vu Le
(74) *Attorney, Agent, or Firm* — Kenta Suzue; Haynes Beffel & Wolfeld LLP

(57) ABSTRACT

A nonvolatile memory cell has a semiconductor substrate, a multilayer stack including a charge trapping layer over a floating gate, a top conductive layer, and circuitry controlling program and erase operations on the nonvolatile memory cell. The program and erase operations change a first charge density on the floating gate by a larger magnitude than a second charge density on the charge trapping dielectric layer.

22 Claims, 27 Drawing Sheets

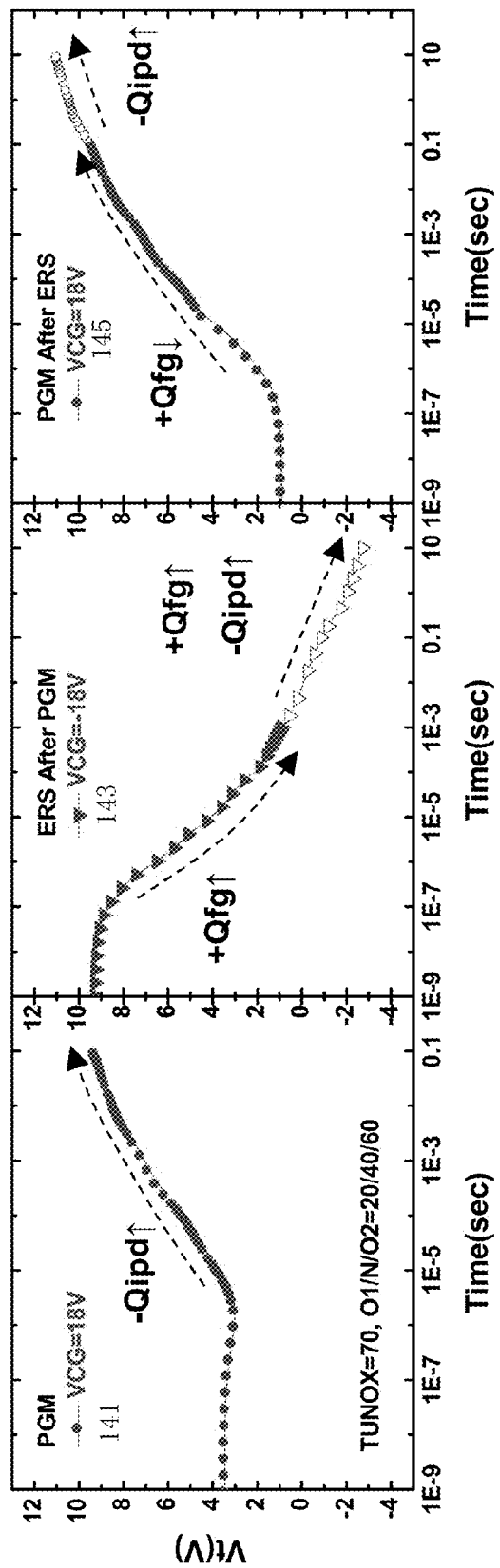

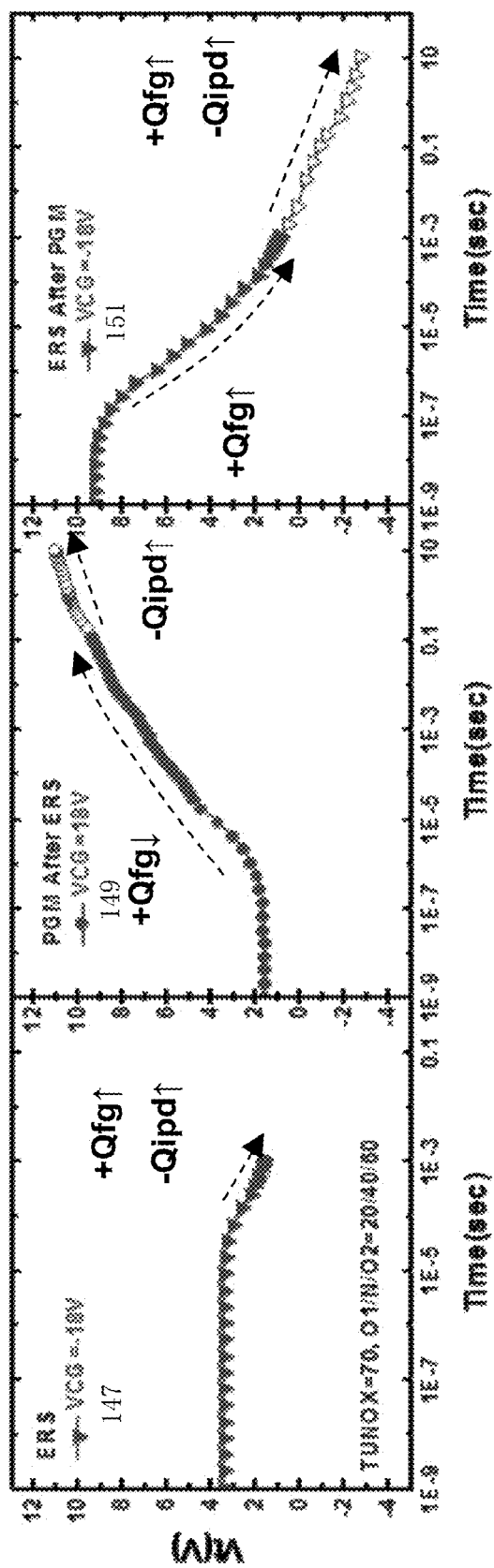

FLOATING GATE MEMORY DEVICE WITH INTERPOLY CHARGE TRAPPING STRUCTURE

BACKGROUND OF THE INVENTION

1. Field of the Invention

The invention relates generally to non-volatile memory devices, and in particular to flash memory and manufacturing of flash memory devices.

2. Description of Related Art

In memory cells using dielectric charge trapping structures, the device can be planar because there is no coupling ratio engineering involved in the design. Because of the planar structure, and very little coupling between adjacent cells, memory cells using dielectric charge trapping structures are forecast to overtake floating gate memory cells in importance as the minimum feature size for the manufacturing processes goes beyond about 45 nanometers.

In some planar memory cells, the floating gate is combined with a dielectric charge trapping structure between the control gate and the floating gate. In such cases the dielectric charge trapping structure has been very difficult to erase, the device is considered difficult to erase and impractical. A planar memory cell can use ONONO for the dielectric charge trapping structure, although at the cost of additional fabrication steps to add the extra layers. In cases where ONONO is used for the dielectric charge trapping structure, charge is programmed and erased primarily on the dielectric charge trapping structure rather than the floating gate.

One problem with planar floating gate devices is that charge is easily injected into the interpoly dielectric because of the presence of a large electric field during programming. However, is very difficult to remove the charge in the interpoly dielectric, making the device very hard to erase, and as a result unusable as in applications of flash memory devices.

It is desirable to make a planar memory cell with a simple dielectric charge trapping structure and yet remain practical to use with satisfactory erase and program performance.

SUMMARY OF THE INVENTION

Another aspect of the technology is a method comprising:
controlling program and erase operations on a nonvolatile memory cell, by changing a first charge density on a floating gate in the nonvolatile memory cell by a larger magnitude than a second charge density on a charge trapping dielectric layer in the nonvolatile memory cell, the floating gate and the charge trapping dielectric layer both planar.

One embodiment of the technology further comprises, the program operations raising a threshold voltage of the nonvolatile memory cell by changing the first charge density to become more negative from a net positive charge density value.

One embodiment of the technology further comprises, the erase operations lowering a threshold voltage of the nonvolatile memory cell by changing the first charge density to become more positive to a net positive charge density value.

One embodiment of the technology further comprises, preceding any of the program and erase operations, changing an initial state of the nonvolatile memory cell such that the charge trapping dielectric layer has the second charge density with an initial program operation.

One embodiment of the technology further comprises, preceding any of the program and erase operations, changing an initial state of the nonvolatile memory cell such that the charge trapping dielectric layer has the second charge density with an initial erase operation.

One embodiment of the technology further comprises, preceding any of the program and erase operations, performing an initial program operation on the nonvolatile memory cell, resulting in a negative charge density on the charge trapping dielectric layer and a nonnegative charge density on the floating gate.

One embodiment of the technology further comprises, performing an initial erase operation on the nonvolatile memory operation, resulting in a negative charge density on the charge trapping dielectric layer and a positive charge density on the floating gate.

One embodiment of the technology further comprises, the nonvolatile memory cell includes:
- a semiconductor substrate having a surface with a source region and a drain region in the substrate and separated by a channel region;
- a multilayer stack over the channel region including a first tunneling barrier structure disposed on the surface of the substrate above the channel region, the floating gate disposed above the first tunneling barrier structure and above the channel region, and the charge trapping dielectric layer above the floating gate and above the channel region; and
- a top conductive layer above the multilayer stack and above the channel region.

In one embodiment of the technology, the charge trapping dielectric layer is an only charge trapping layer in the multilayer stack.

In one embodiment of the technology, the program and erase operations on the nonvolatile memory cell change the second charge density on the charge trapping dielectric layer in the nonvolatile memory cell by no more than 50%.

One embodiment of the technology further comprises, performing an additional operation—program or erase—on the nonvolatile memory cell that changes the second charge density on the charge trapping dielectric layer, by applying a second bias arrangement having a voltage magnitude larger than the first magnitude or first duration of the program operations or the erase operations.

One aspect of the technology is a nonvolatile memory cell comprising a semiconductor substrate, a multilayer stack, a top conductive layer, and control circuitry. The semiconductor substrate has a surface with a source region and a drain region in the substrate and separated by a channel region. The multilayer stack over the channel region includes a first tunneling barrier structure disposed on the surface of the substrate above the channel region, a floating gate disposed above the first tunneling barrier structure and above the channel region, and a charge trapping dielectric layer above the floating gate and above the channel region. The floating gate and the charge trapping dielectric both planar. The top conductive layer is above the multilayer stack and above the channel region. The circuitry controls program and erase operations on the nonvolatile memory cell. The program and erase operations change a first charge density on the floating gate by a larger magnitude than a second charge density on the charge trapping dielectric layer.

In one embodiment of the technology, the program operations controlled by the circuitry raise a threshold voltage of the nonvolatile memory cell by changing the first charge density to become more negative from a net positive charge density value.

In one embodiment of the technology, the erase operations controlled by the circuitry lower a threshold voltage of the nonvolatile memory cell by changing the first charge density to become more positive to a net positive charge density value.

In one embodiment of the technology, the nonvolatile memory cell has an initial state preceding any of the program and erase operations, and the circuitry controls an initial operation preceding any of the program and erase operations that changes the initial state such that the charge trapping dielectric layer has the second charge density. The initial operation can be a program operation or an erase operation. The initial operation can result in a negative charge density on the charge trapping dielectric layer and a nonnegative charge density on the floating gate.

In one embodiment of the technology, circuitry controls the program operations to apply a first program bias arrangement having a first program voltage magnitude. The circuitry controls an additional program operation on the nonvolatile memory cell that changes the second charge density on the charge trapping dielectric layer, by applying a second program bias arrangement having a second program voltage magnitude larger than the first program voltage magnitude.

In one embodiment of the technology, circuitry controls the program operations to apply a first program bias arrangement having a first program duration. The circuitry controls an additional program operation on the nonvolatile memory cell that changes the second charge density on the charge trapping dielectric layer, by applying a second program bias arrangement having a second program duration longer than the first program duration.

In one embodiment of the technology, circuitry controls the erase operations to apply a first erase bias arrangement having a first erase voltage magnitude. The circuitry controls an additional erase operation on the nonvolatile memory cell that changes the second charge density on the charge trapping dielectric layer, by applying a second erase bias arrangement having a second erase voltage magnitude larger than the first erase voltage magnitude.

In one embodiment of the technology, circuitry controls the erase operations to apply a first erase bias arrangement having a first erase duration. The circuitry controls an additional erase operation on the nonvolatile memory cell that changes the second charge density on the charge trapping dielectric layer, by applying a second erase bias arrangement having a second erase duration longer than the first erase duration.

In one embodiment of the technology, the charge trapping dielectric layer is an only charge trapping layer in the multilayer stack.

Another aspect of the technology is a method of manufacturing a memory cell, comprising:
  providing a semiconductor substrate having a surface with a source region and a drain region in the substrate and separated by a channel region;
  providing a multilayer stack over the channel region including a first tunneling barrier structure disposed on the surface of the substrate above the channel region, a floating gate disposed above the first tunneling barrier structure and above the channel region, and a charge trapping dielectric layer above the floating gate and above the channel region, the floating gate and the charge trapping dielectric both planar; and
  providing a top conductive layer above the multilayer stack and above the channel region;
  providing circuitry controlling program and erase operations on the memory cell, wherein the program and erase operations change a first charge density on the floating gate by a larger magnitude than a second charge density on the charge trapping dielectric layer. Other aspects and advantages of the present invention can be seen on review of the drawings, the detailed description and the claims, which follow.

BRIEF DESCRIPTION OF THE DRAWINGS

FIGS. 35-37 are graphs of threshold voltage showing program and erase cycle behavior, respectively showing in sequence an initial program operation, a subsequent erase operation, and then another program operation.

FIGS. 38-40 are graphs of threshold voltage showing program and erase cycle behavior, respectively showing in sequence an initial erase operation, a subsequent program operation, and then another erase operation.

DETAILED DESCRIPTION

Figure 1:
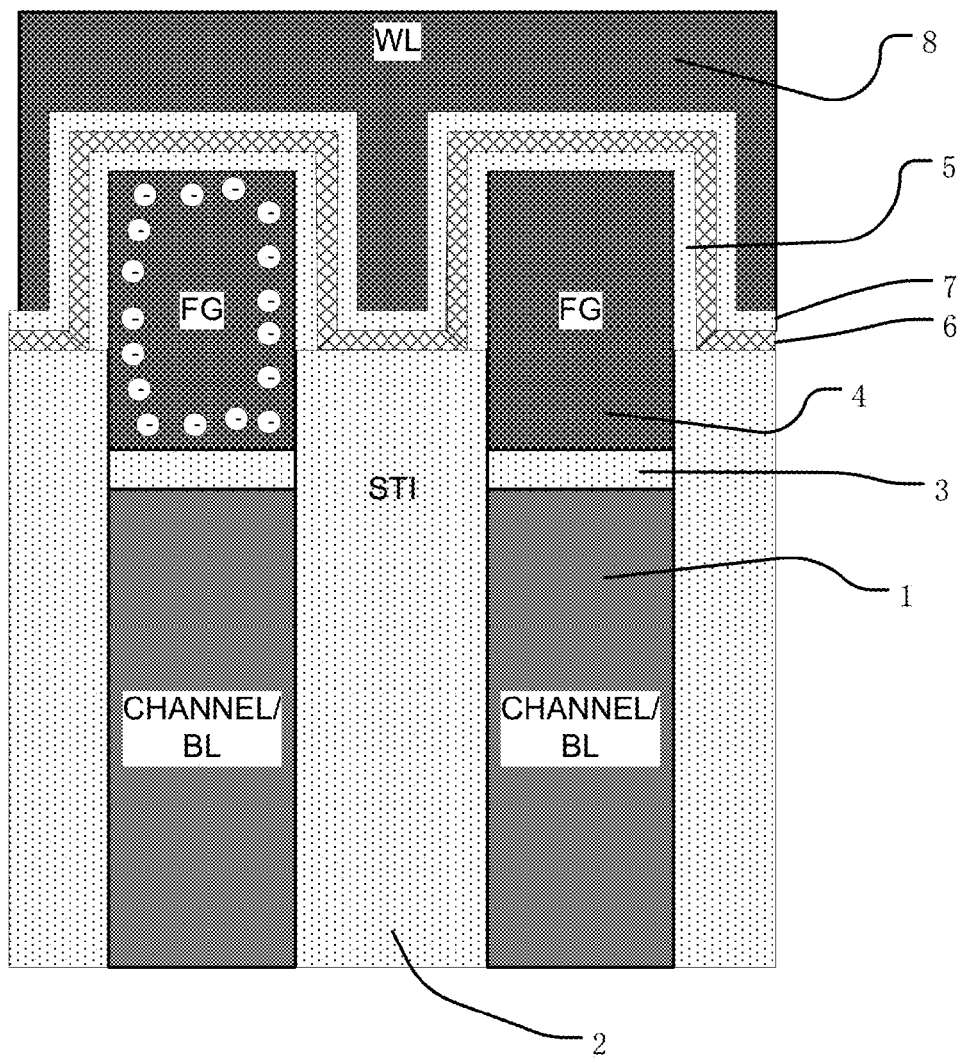
FIG. 1 illustrates a cross-sectional view taken along the wordline dimension of a prior art floating gate memory cell.

FIG. 1 is a cross-section of a conventional floating gate device taken along a wordline 8. The channels 1 of the memory cells are formed on a semiconductor body and extend in a direction perpendicular to the page as a bit line. Each of the bit lines in the semiconductor body is separated from another by a dielectric trench 2, formed using technologies such as shallow trench isolation STI or other approaches. A tunneling barrier structure 3, such as a tunnel oxide, is formed on the channels 1. The polysilicon floating gate 4 is formed on tunneling barrier structure 3. An interpoly dielectric, comprising in this example silicon oxide layer 5, silicon nitride layer 6, and silicon oxide layer 7, is formed over the polysilicon floating gate 4. The nonplanar interpoly dielectric (5-7) is designed to block charge leakage between the wordline 8 and the floating gate 4. Also, the floating gate 4 must be relatively thick (typically greater than 100 nanometers in current technologies) in order to provide a large surface area for coupling between the floating gate 4 and the wordline 8. This large surface area increases the gate coupling ratio of the floating gate device, transferring a larger voltage from the wordline 8 to the floating gate 4 during programming and erasing. However, the thick floating gate element causes severe interference between adjacent floating gates of adjacent lines. In the illustration, electrons are shown distributed around the surface of the floating gate in the memory cell on the left side of the figure. Any electrons in the floating gate 4 in the memory cell on the right side of the figure will create an unwanted electric field between the adjacent floating gates, and result in charge leakage, for example through de-trapping into surrounding defects or oxide traps in the STI. This problem of interference between adjacent cells has been a significant motivation for the study and implementation of SONOS-type dielectric charge trapping devices, where the charges are trapped in deep traps and are less prone to interference from adjacent cells causing charge leakage.

Moreover, as the manufacturing technologies for memory cells enable 30 nanometers devices, the number of electrons stored in a given cell is becoming very small. It is believed for example that fewer than 100 electrons would be used to establish the memory state in small memory cells. As the number of electrons establishing the memory state becomes smaller and smaller, interference between adjacent cells and other forms of charge leakage are becoming more critical to the design of the memory cell structure.

Figure 2:
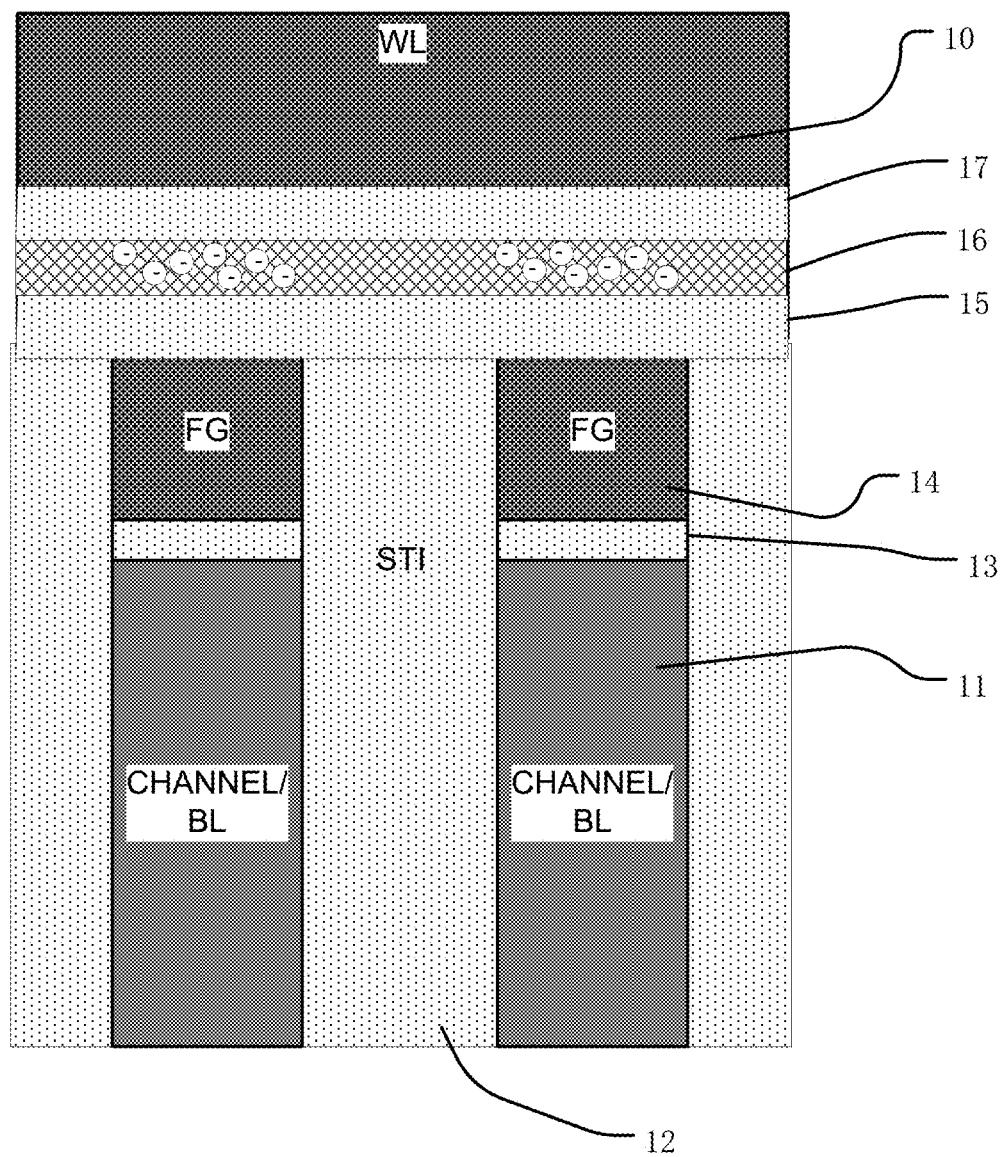
FIG. 2 illustrates a cross-sectional view taken along the wordline dimension of a prior art floating gate memory cell, with a planar cell structure and a continuous charge trapping architecture.

FIG. 2 is a cross-section of a floating gate device taken along wordline 10. In the structure shown in FIG. 2, channels 11 of the memory cells are formed on the semiconductor body and extend in a direction perpendicular to the page as bit lines. Each of the channels in the semiconductor body is separated from another by a dielectric trench 12. A tunneling barrier structure 13 is formed on the channels 11. A floating gate 14 is formed on the tunneling barrier structure 13. A planar, or near-planar, interpoly dielectric (IPD) also called an intergate dielectric (IGD), comprises in this example dielectric layer 15, charge trapping structure 16, and dielectric layer 17, and extends across the top surfaces of floating gate structures along the wordline 10. The silicon nitride layer 16 is shown as charged with electrons, following initial program or erase operations as discussed below. Program and erase operations that add or remove charge form the IGD can store or remove the charge from the charge trapping structure 16 of the IGD.

In certain embodiments, the tunneling barrier structure 13 can comprise silicon dioxide or silicon oxynitride. In certain embodiments, the tunneling barrier structure 13 comprises silicon dioxide having a thickness on the order of 4 to 6 nanometers. In certain embodiments the charge trapping structure 16 comprises silicon nitride, silicon rich nitride, nano-particle embedded dielectrics, or other charge trapping materials. In certain embodiments, the charge trapping structure 106 comprises silicon nitride having a thickness on the order of 3 to 7 nanometers. In certain embodiments, the dielectric layers 15 and 17 (having an EOT on the order of 2 to 5 nanometers) comprise silicon dioxide, or other dielectric material such as a "high-κ" metal oxide like $Al_2O_3$, $Hf_2O_3$, etc. Also, in certain embodiments the floating gate 14 may comprise p-type polysilicon, n-type polysilicon, or undoped polysilicon. In certain embodiments the wordline 10 (also top conductive layer, gate, or control gate) may comprise p-type polysilicon, n-type polysilicon, other doped semiconductor materials. Other embodiments employ metals, metal compounds or combinations of metals and metal compounds for the gate, such as platinum, tantalum nitride, metal silicides, aluminum or other metal or metal compound gate materials (e.g. from Ti, TiN, Ta, Ru, Ir, $RuO_2$, $IrO_2$, W, WN, and others. The materials chosen in these example embodiments are representative of materials that are easily manufactured. A wide variety of other materials and combinations can also be used for the memory cell layers and structures.

In a representative embodiment, dielectric layer 15, charge trapping structure 16, and dielectric layer 17 is referred to as O1/N/O2 such that the IPD/IGD includes a nitride layer; and tunneling barrier structure 13 is referred to as tunnel oxide.

Figure 3:
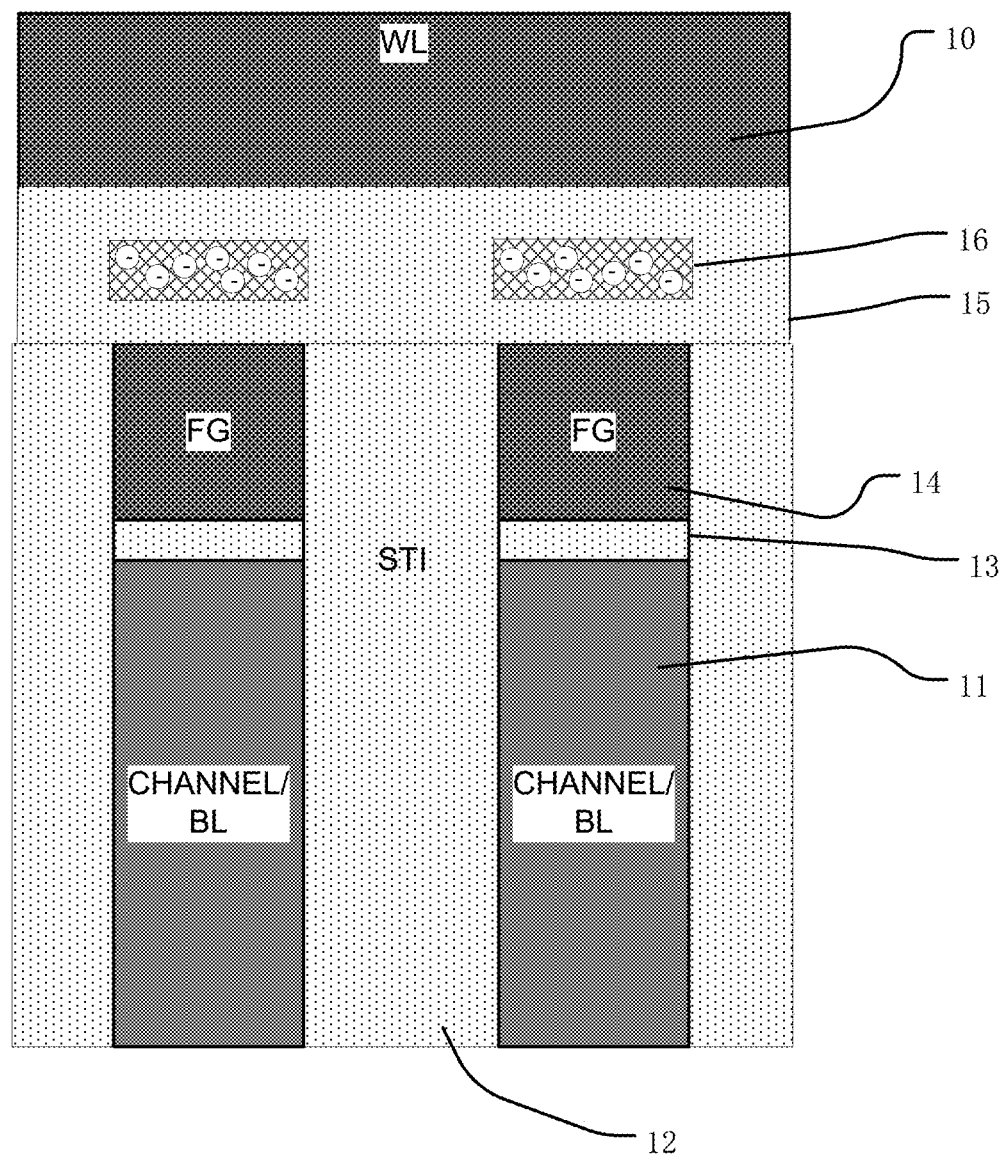
FIG. 3 illustrates a cross-sectional view taken along the wordline dimension of a prior art floating gate memory cell, with a planar cell structure and a lumped charge trapping architecture.

FIG. 3 is a cross-section of a floating gate device taken along wordline 10. The structure shown in FIG. 3 is similar to the structure shown in FIG. 2, except that the charge trapping layer 16 is "lumped" rather than continuous, such that the charge trapping layer 16 is discontinuous in between adjacent channels 11. The charge trapping layer 16 is shown as charged with electrons, following initial program or erase operations as discussed below.

Figure 4:
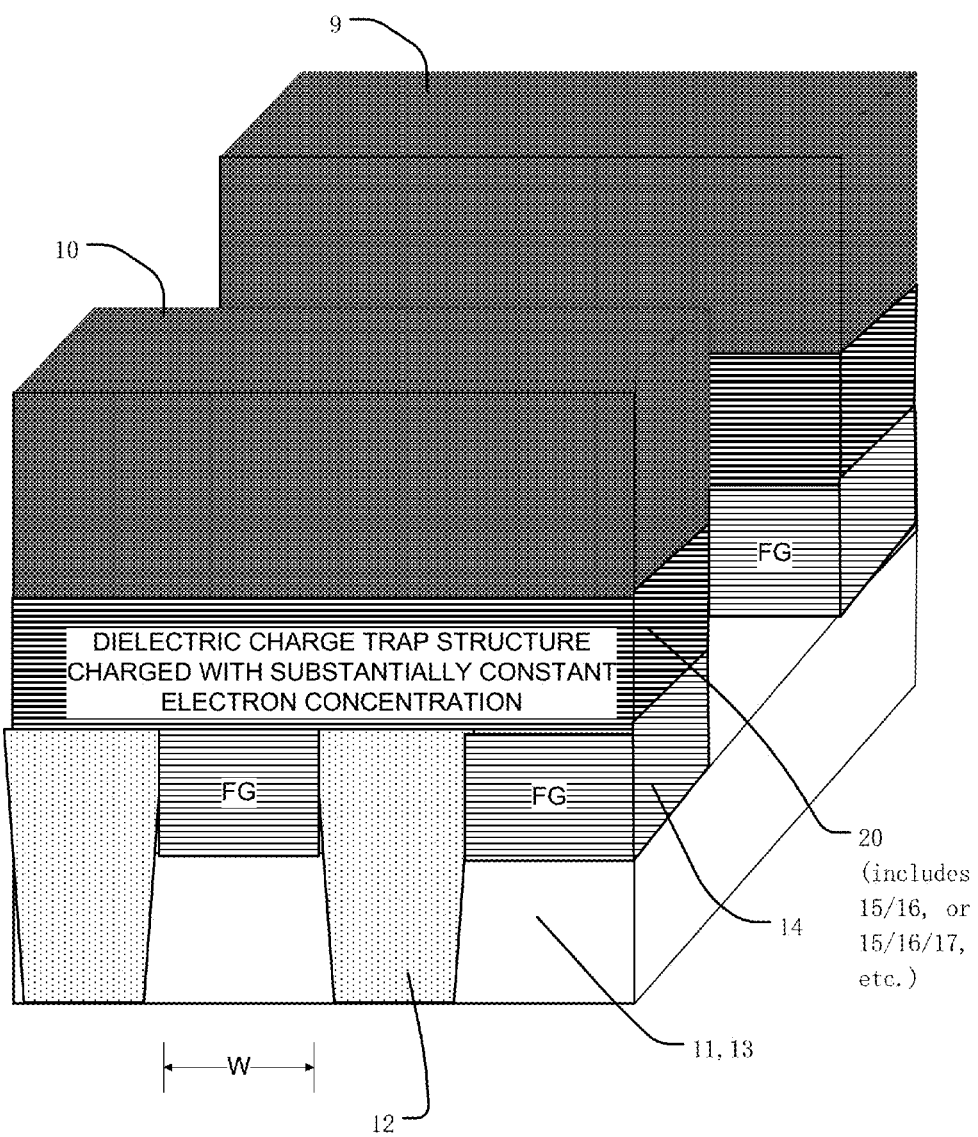
FIG. 4 illustrates a perspective view of a memory array comprising memory cells as described herein with a combination of a floating gate structure and a dielectric charge trapping structure with a substantially constant charge density after charging of the charge trapping layer.

FIG. 4 illustrates in simplified perspective, a part of the array structure on a substrate with a first wordline 10 and a second wordline 9 arranged along rows of memory cells. Source and drain regions are defined on opposite sides of the wordlines by implanted dopants between the wordlines. A dielectric fill (removed in the FIG. 4 for visibility) is between the wordlines. Trench isolation structure 12 electrically isolates adjacent floating gates and adjacent bit lines. In FIG. 4, the structure is simplified to show the dielectric charge trapping element 20 above the floating gate element 14 and the as a single unit, in recognition that the dielectric charge trapping element 20 can be made using configurations such as lumped or continuous, and with different materials and combinations of thicknesses. The near planar structure of the resulting devices enables scaling the pitch of the memory cells as the minimum feature sizes shrink for the manufacturing processes.

Memory cells as described herein can be implemented in other array structures as well. For example, array structures using charge trapping/floating gate memory cells as described herein can be implemented in NOR configurations and in NAND configurations. In addition, memory arrays using the charge trapping/floating gate memory cells as described herein can be implemented using thin-film transistor TFT techniques and silicon-on-insulator techniques. The floating gate/charge trapping memory device can be implemented in both p-channel and n-channel technologies.

Figure 5:
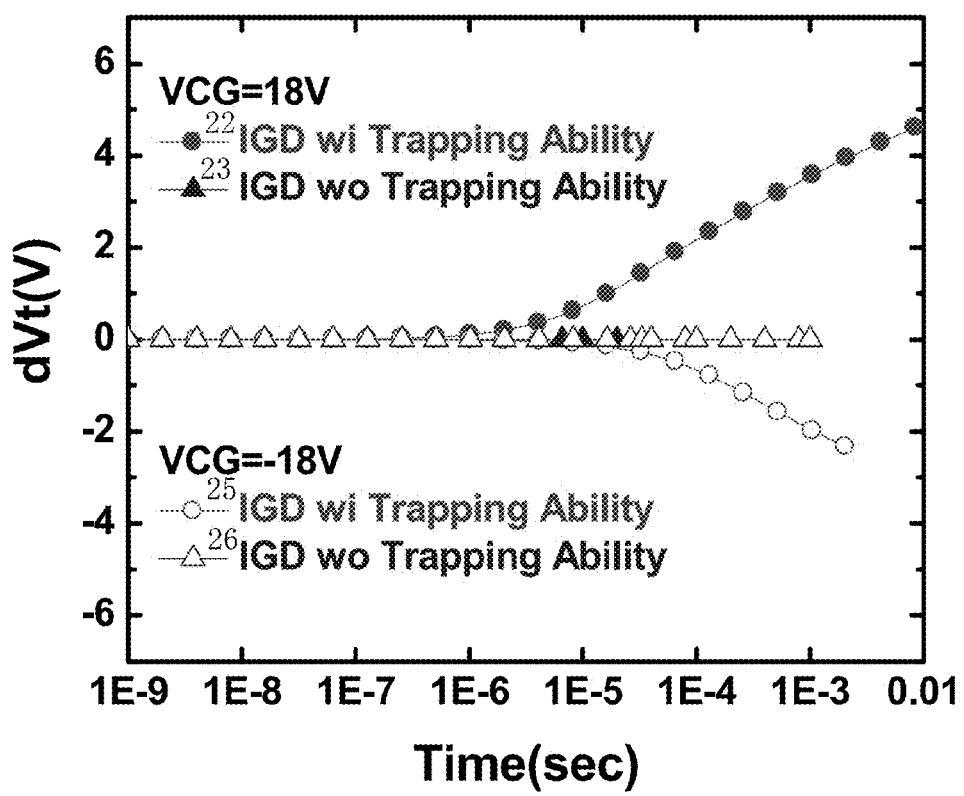
FIG. 5 is a graph of threshold voltage shift with and without a charge trapping, for positive and negative gate voltages.

FIG. 5 is a graph of threshold voltage shift with and without a charge trapping, for positive and negative gate voltages. FIG. 5 shows program traces with a control gate voltage of 18V for an IGD that traps charge 22 and does not trap charge 23. FIG. 5 also shows erase traces with a control gate voltage of −18V for an IGD that traps charge 25 and does not trap charge 26.

With a practical nonvolatile memory device, program and erase operations result in a sufficient program and erase window, or threshold voltage difference following program and erase operations. With an IGD 16 that lacks the ability to trap charge as in traces 23 and 26, no program and erase window opens. With an IGD 16 that has the ability to trap charge as in traces 22 and 25, a program and erase window opens.

Figure 6:
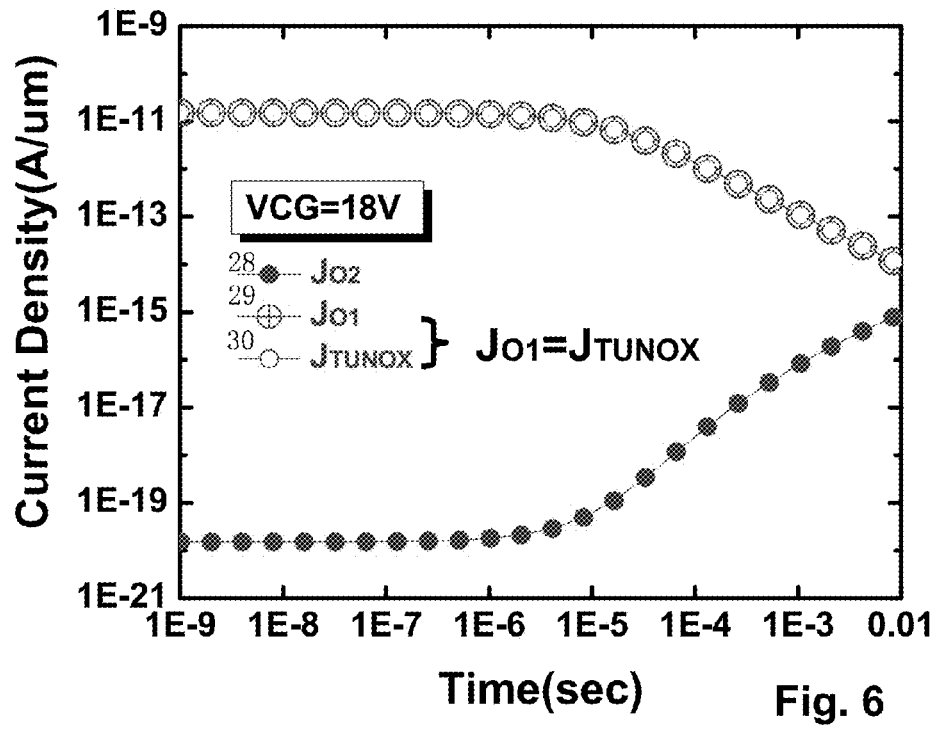
FIG. 6 is a graph of current densities in the different oxide layers, with charge trapping.

FIG. 6 is a graph of current densities in the different oxide layers, with charge trapping. FIG. 6 shows program traces with a control gate voltage of 18V, showing current densities in O2, O1, and tunnel oxide. In the early part of the graph, trace 28 for current density in O2 is extremely low due to the IGD trapping charge, as compared to trace 29 for current density in O1 and trace 30 for current density in the tunnel oxide. This disparity in current densities indicates that in the early part of the graph, current density-in is much larger than current density-out, such that a program and erase window is opened. Trace 29 for current density in O1 is equal to trace 30 for current density in the tunnel oxide.

FIGS. 7-10 relate to a program and erase window without charge trapping.

Figure 7:
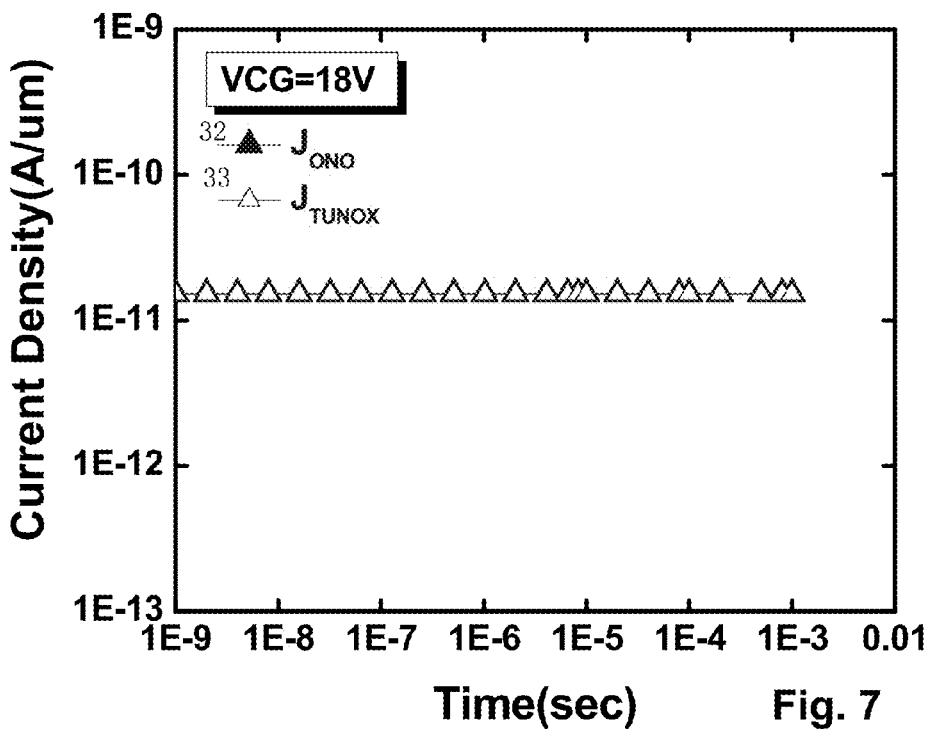
FIG. 7 is a graph of current densities in the different oxide layers, without charge trapping.

FIG. 7 is a graph of current densities in the different oxide layers, without charge trapping. FIG. 7 shows program traces with a control gate voltage of 18V, showing current densities in ONO 32 and tunnel oxide 33. The IGD 16 does not trap charge in this simulation, despite the nitride. Trace 32 for current density in ONO is equal to trace 33 for current density in the tunnel oxide. This equality in current densities indicates that current density-in is substantially equal to current density-out, and that a program and erase window does not open. The current density-in is substantially equal to current density-out, because of the same electric field across the tunnel oxide and the IGD. The same electric field is due to the planar structure of the nonvolatile memory cell.

A formula for the GCR (gate coupling ratio) follows, with terms for the area and capacitance for the IGD and the tunnel oxide, where effective oxide thickness is substituted for capacitance, as follows:

$$GCR = A_{igd} * C_{igd} / (A_{igd} * C_{igd} + A_{tunox} * C_{tunox})$$

$$= A_{igd} * EOT/tunox(A_{igd} * EOT_{tunox} + A_{tunox} * EOT_{igd})$$

In the GCR formula above, GCR is higher with a large $A_{igd}$ and thin $EOT_{igd}$ In a planar cell configuration, $A_{igd} = A_{tunox}$ resulting in the simpler GCR formula:

$$GCR = EOT_{tunox} / (EOT_{tunox} + EOT_{igd})$$

In the GCR formula above, GCR is higher with a thin $EOT_{igd}$. EOT is defined as being equal to the thickness of the dielectric layers scaled by the ratio of the dielectric constant of silicon dioxide to the dielectric constant of the material of the layer. However, thin $EOT_{igd}$ degrades reliability and may affect the program and erase window. One solution is a high-k IGD that is thin enough electrically or capacitively, and thick enough thick enough regarding tunneling.

In one approach, the IGD structure relies on O1/N/O2, where O1 and O2 are silicon oxide and N is silicon nitride. O1 is between the floating gate and the silicon nitride. O2 is between the silicon nitride and the control gate. In some embodiments, both the O1 and O2 interfacial oxide are thicker than 40 Å for reliability. With these thicknesses, program and erase operations result in an electric field magnitude of about 10-12 MV/cm. Under the simulation condition that the IGD does not trap charge, FN injection dominates. Regardless of whether the GCR is larger or small, injection current into the floating gate 14 equals ejection current out of the floating gate 14. As shown in connection with FIGS. 7-10, when current density-in is substantially equal to current density-out, a program and erase window is not opened.

Figure 8:
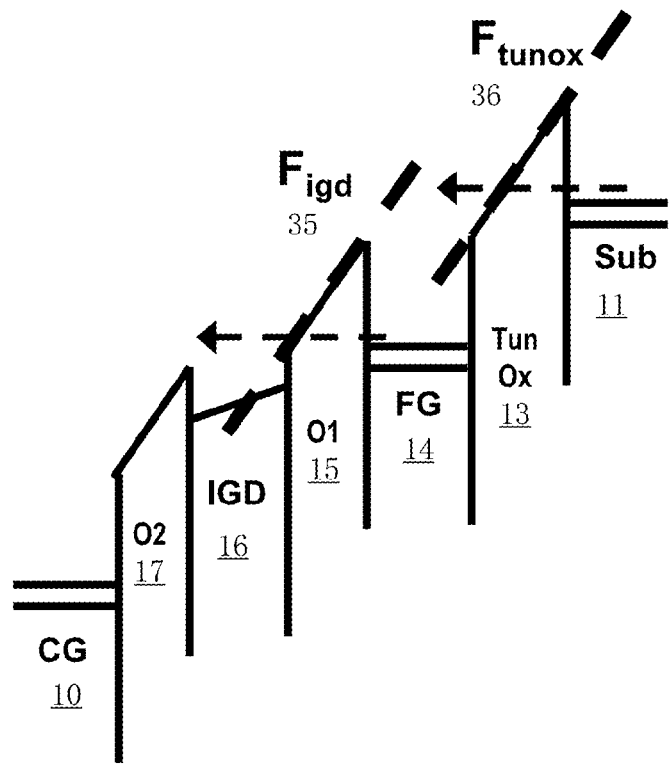
FIG. 8 is a band diagram of a program operation without charge trapping.

FIG. 8 is a band diagram of a program operation without charge trapping. The band diagram includes, from left to right, control gate 10, O2 17, IGD 16, O1 15, floating gate 14, tunnel oxide 13, and substrate 11. FIG. 8 shows equal electric fields for $F_{igd}$ 35 and $F_{tunox}$ 36.

Figure 9:
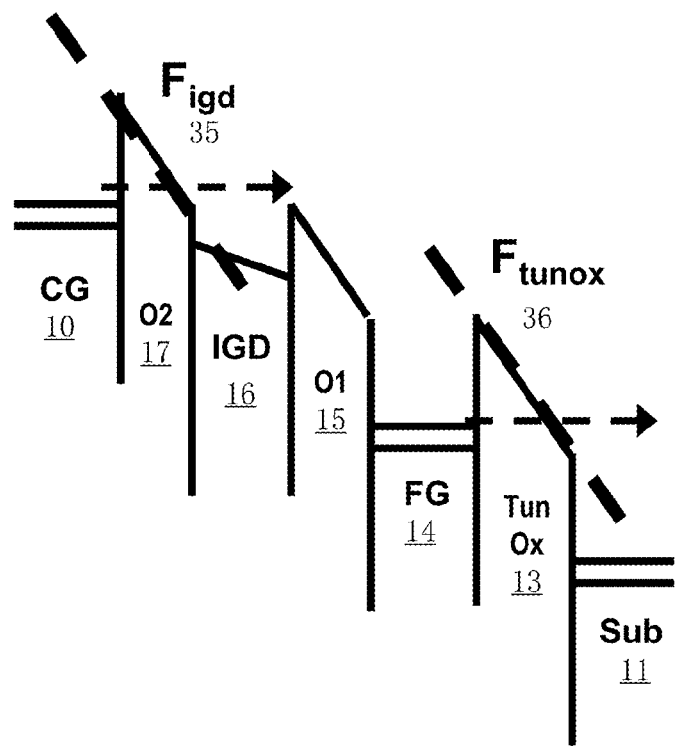
FIG. 9 is a band diagram of an erase operation without charge trapping.

FIG. 9 is a band diagram of an erase operation without charge trapping. The band diagram includes, from left to right, control gate 10, O2 17, IGD 16, O1 15, floating gate 14, tunnel oxide 13, and substrate 11. FIG. 8 shows equal electric fields for $F_{igd}$ 35 and $F_{tunox}$ In both FIGS. 8 and 9, the IGD 16 does not trap charge. Applying Gauss's Law, where the divergence of the electric field indicates charge density, due to the equal electric fields $F_{igd}$ 35 and $F_{tunox}$ 36, at steady state, charge density on the floating gate 14 is zero (and charge density on the IGD is zero).

Figure 10:
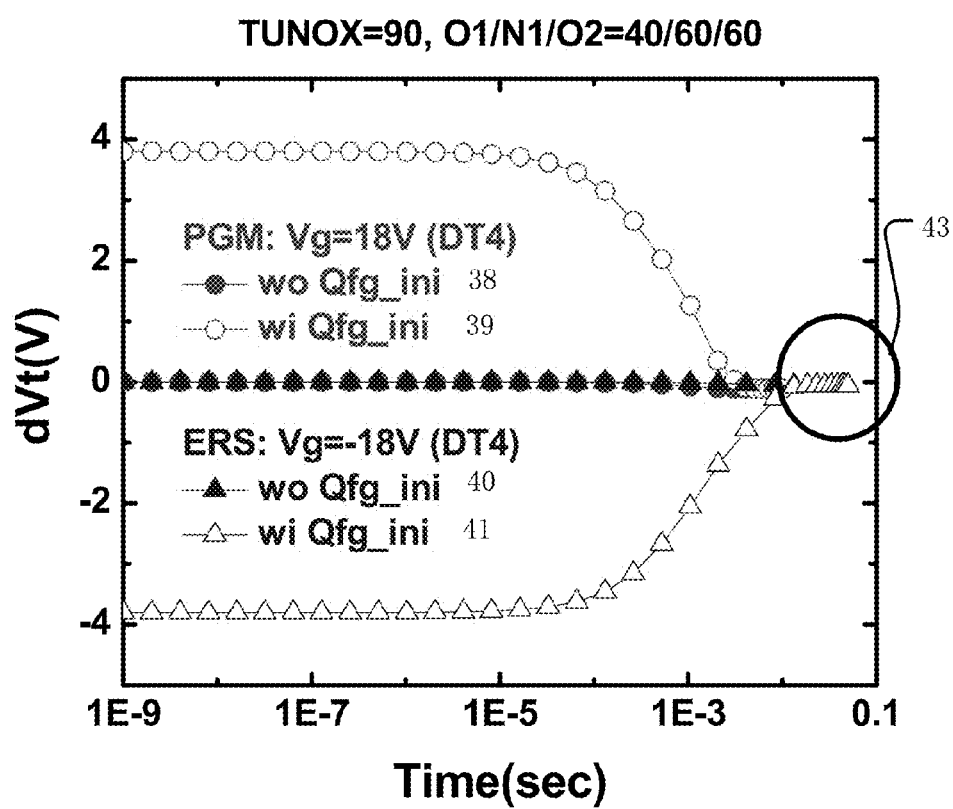
FIG. 10 is a graph of threshold voltage shift for program and erase operations, with and without an initial charge density on the floating gate.

FIG. 10 is a graph of threshold voltage shift for program and erase operations, with and without an initial charge density on the floating gate. FIG. 10 shows program traces with a control gate voltage of 18V for an IGD that does not trap charge, with an initial charge density on the floating gate 39 and without an initial charge density on the floating gate 38. FIG. 10 also shows erase traces with a control gate voltage of −18V for an IGD that does not trap charge, with an initial charge density on the floating gate 41 and without an initial charge density on the floating gate 40. All traces merge at a convergence 43 at the right of the graph, indicating that at steady state the charge density on the floating gate is zero (and charge density on the IGD is zero), regardless of the initial charge density on the floating gate.

FIGS. 11-15 relate to a program and erase window with direct tunneling.

Figure 11:
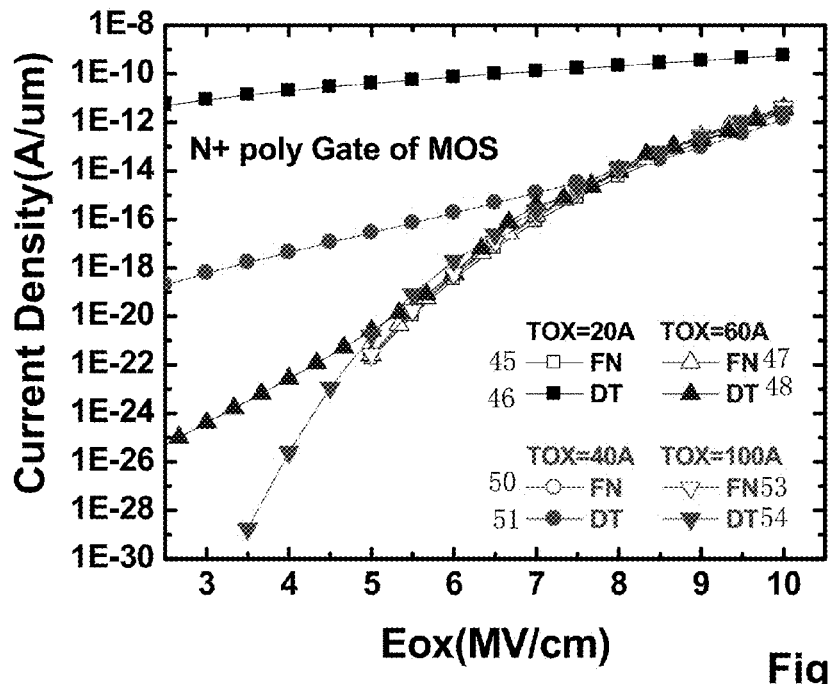
FIG. 11 is a graph of current density vs electric field in tunnel oxide for various tunnel oxide thicknesses and different current mechanisms.

FIG. 11 is a graph of current density vs electric field in tunnel oxide for various tunnel oxide thicknesses and different current mechanisms.

For a tunnel oxide with a thickness of 20 A, traces 45 and 46 show current density components from FN tunneling and direct tunneling respectively. For a tunnel oxide with a thickness of 40 A, traces 50 and 51 show current density components from FN tunneling and direct tunneling respectively. For a tunnel oxide with a thickness of 60 A, traces 47 and 48 show current density components from FN tunneling and direct tunneling respectively. For a tunnel oxide with a thickness of 100 A, traces 53 and 54 show current density components from FN tunneling and direct tunneling respectively. The graph shows that direct tunneling dominates with a tunnel oxide thickness of 20 A throughout the range of electric fields. For O1 thickness of 20 A, for electric magnitudes >10 MV/cm, tunneling is determined by O1 only, as the conduction band edge of silicon nitride Ec(SiN) is offset from the conduction band edge of silicon oxide Ec(SiO$_2$) by 1.2 eV. The graph shows also that for higher thicknesses of tunnel oxide, at higher electric field magnitudes, FN tunneling dominates direct tunneling. The graph shows also that as the tunnel oxide thickness increases, the electric field range at which FN tunneling dominates extends further into lower electric field values. The simulation overstates current for tunnel oxide thicknesses less than 60 A due to the exclusion of SiN from the simulation.

Figure 12:
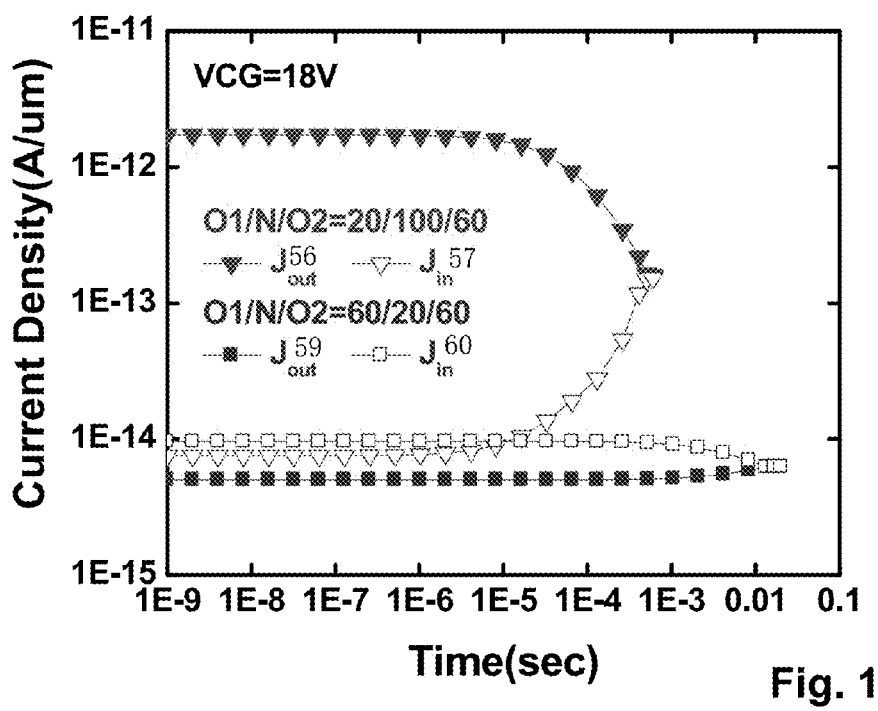
FIG. 12 is a graph of current density for a program operation for various thicknesses of O1 oxide between nitride and floating gate.

FIG. 12 is a graph of current density for a program operation for various thicknesses of O1 oxide between nitride and floating gate.

For an IGD structure with O1/N/O2 having respective thicknesses of 20 A/100 A/60 A, traces 56 and 57 show respectively current density-out and current density-in. The large difference shows the dominance of the direct tunneling current component in trace 56 showing current density-out from the floating through O1 15 toward the control gate, over the FN tunneling current component in trace 57 showing current density-in from the channel toward the floating gate. Since the current density-out is larger than the current density-in, a PGM window opens. For an IGD structure with O1/N/O2 having respective thicknesses of 60 A/20 A/60 A, traces 59 and 60 show respectively current density-out and current density-in. Traces 57, 59, and 60 show dominance of the FN tunneling current component.

Figure 13:
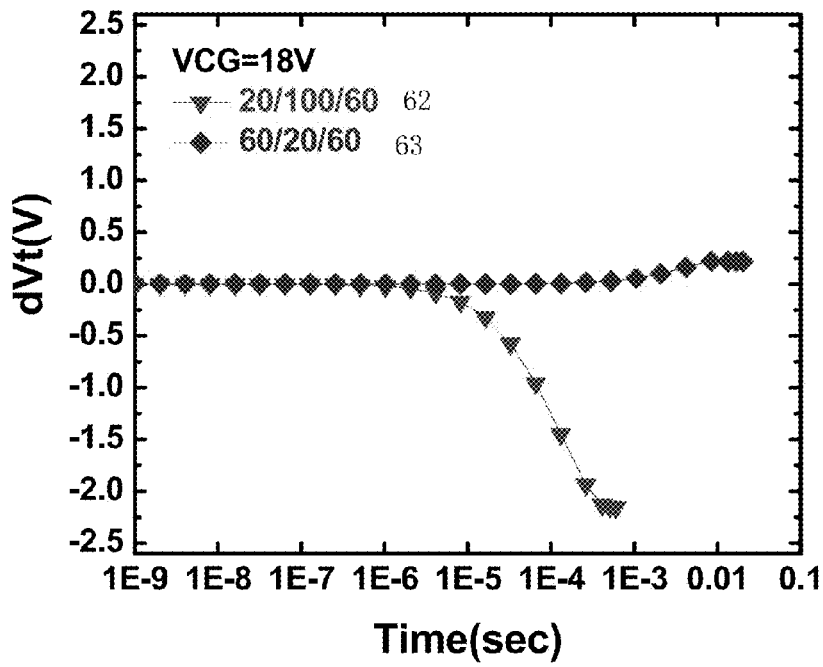
FIG. 13 is a graph of threshold voltage shift for a program operation for various thicknesses of O1 oxide between nitride and floating gate.

FIG. 13 is a graph of threshold voltage shift for a program operation for various thicknesses of O1 oxide between nitride and floating gate.

When a control gate applies a programming voltage of 18V, traces 62 and 63 show the voltage shift with, respectively, an IGD structure with O1/N/O2 having respective thicknesses of 20 A/100 A/60 A, and an IGD structure with O1/N/O2 having respective thicknesses of 60 A/20 A/60 A. Trace 62 with O1/N/O2 having respective thicknesses of 20 A/100 A/60 A shows a PGM window open in the reverse direction, because of the negative voltage shift. Trace 63 with O1/N/O2 having respective thicknesses of 60 A/20 A/60 A shows a minimal PGM window. For program, the thickness of O1 determines the voltage shift behavior.

Figure 14:
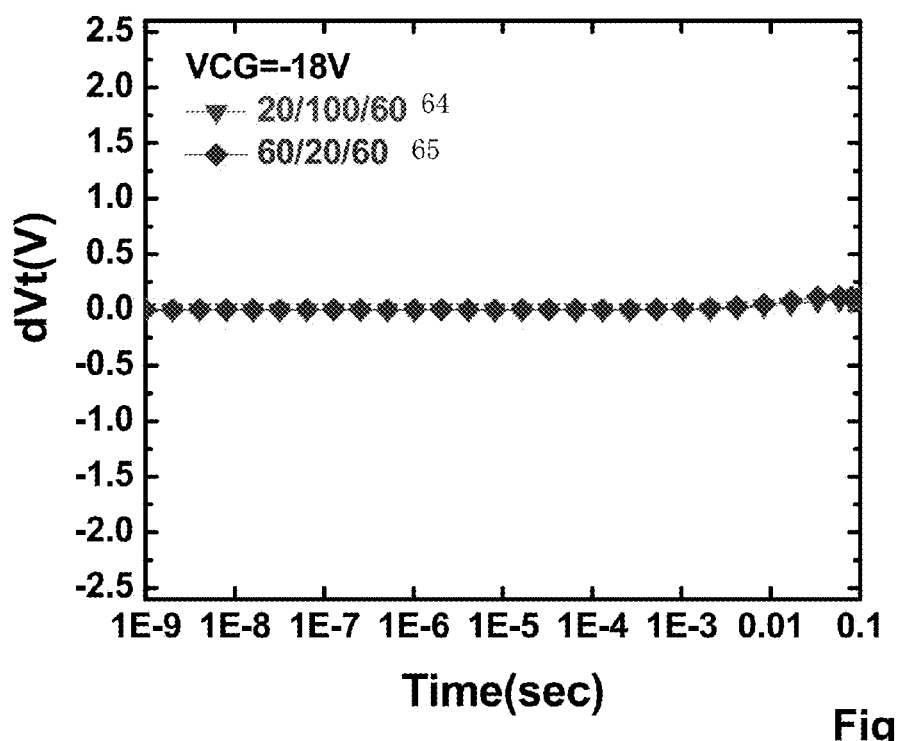
FIG. 14 is a graph of threshold voltage shift for an erase operation for various thicknesses of O1 oxide between nitride and floating gate.

FIG. 14 is a graph of threshold voltage shift for an erase operation for various thicknesses of O1 oxide between nitride and floating gate.

When a control gate applies an erase voltage of −18V, traces 64 and 65 show the voltage shift with, respectively, an IGD structure with O1/N/O2 having respective thicknesses of 20 A/100 A/60 A, and an IGD structure with O1/N/O2 having respective thicknesses of 60 A/20 A/60 A. Neither trace 64 nor trace 65 shows an erase window opening, as current into the floating gate equals current out of the floating gate in both traces 64 and 65. For erase, the thickness of O2 determines the voltage shift behavior.

Figure 15:
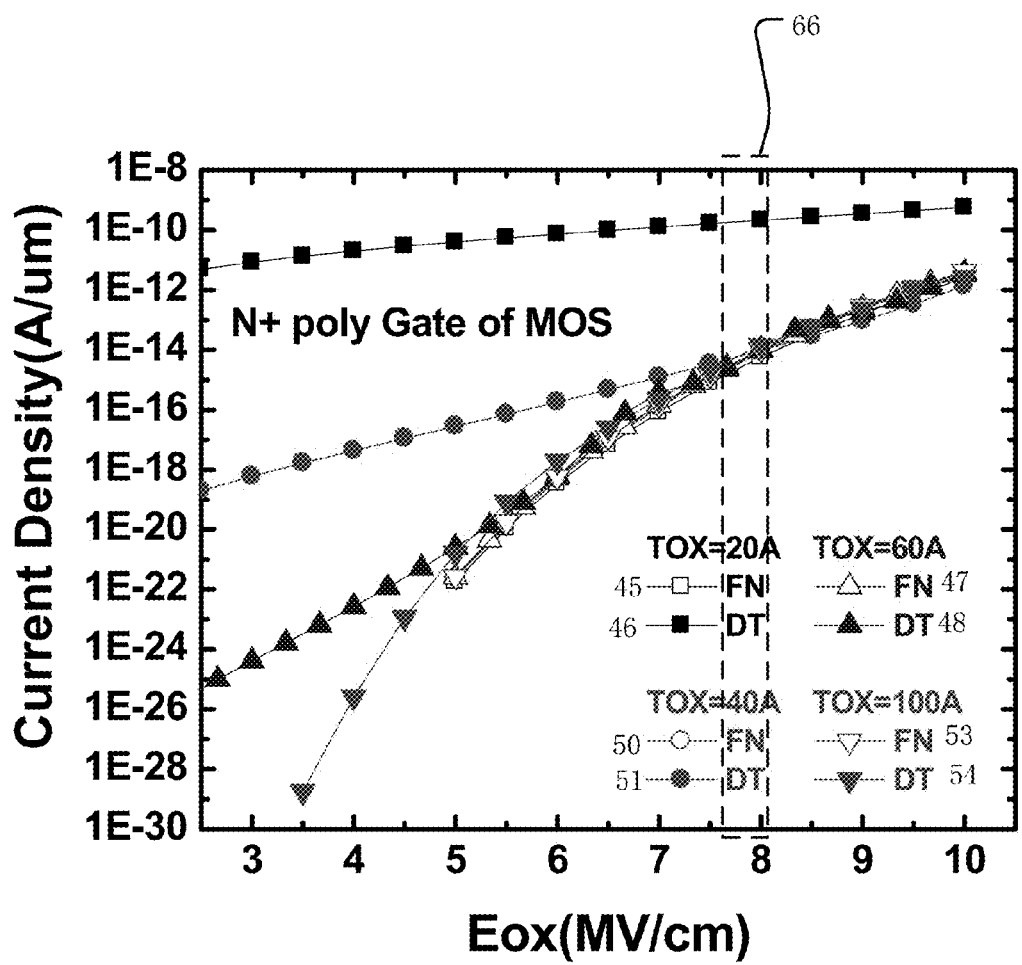
FIG. 15 is a graph of current density for a program operation for various thicknesses of tunnel oxide.

FIG. 15 is a graph of current density for a program operation for various thicknesses of tunnel oxide as in FIG. 11, supplemented with box 66 indicating a range of interest for the magnitude of electric fields for program and erase operations in connection with FIGS. 13 and 14.

FIGS. 16-22 relate to IGD fixed trapping, where charge is not trapped during program and erase operations, and are instead placed on the IGD prior to program and erase operations.

Figure 16:
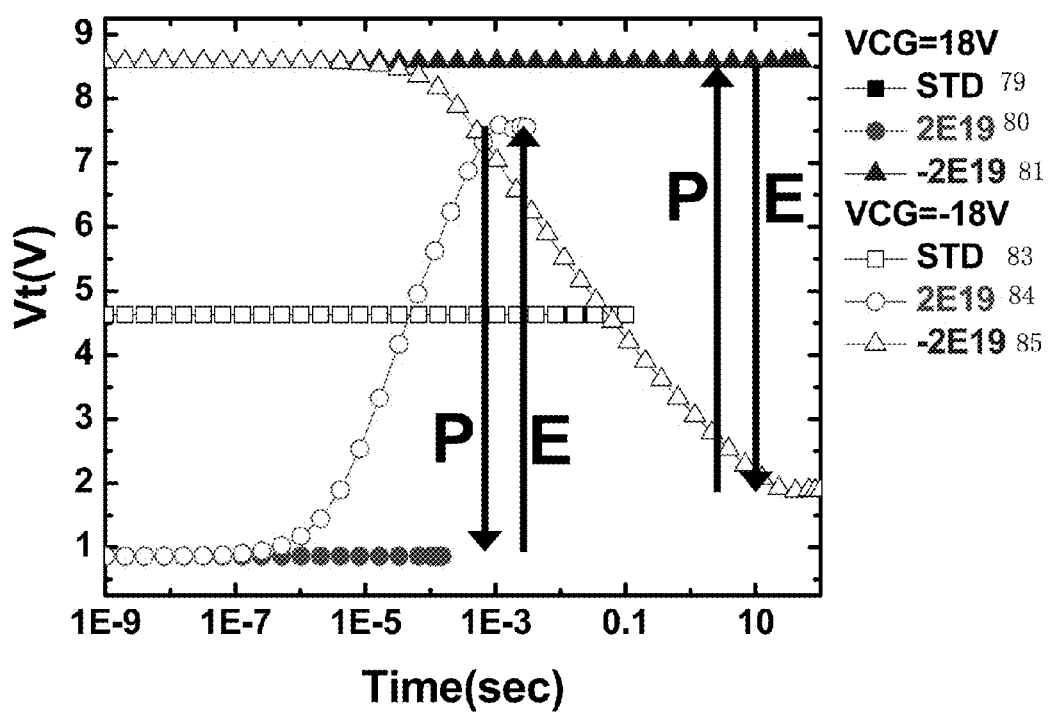
FIG. 16 is a graph of threshold voltage for program and erase operations, with various charge densities fixed on the charge trapping layer.

FIG. 16 is a graph of threshold voltage for program and erase operations, with various charge densities fixed on the charge trapping layer. For IGD structure O1/N/O2 with O1 and O2 thicknesses of at least 40 A, FN tunneling is the dominant current mechanism. The amount of fixed charge on the charge trapping layer does not affect the GCR. The simulated planar device has O1/N1/O2 thicknesses of 40 A/60 A/60 A, and tunnel oxide thickness of 100 A.

When a control gate applies a programming voltage of 18V, traces 79, 80, and 81 show the threshold voltage with IGD charge density (C/um) on the charge trapping layer respectively of no charge, $2 \times 10^{19}$, and $-2 \times 10^{19}$. None of the programming traces shows a threshold voltage shift.

When a control gate applies an erase voltage of −18V, traces 83, 84, and 85 show the threshold voltage with IGD charge density (C/um) on the charge trapping layer respectively of no charge, $2 \times 10^{19}$, and $-2 \times 10^{19}$. Unlike all of the program traces, erase trace 84 shows a "reverse" window in which erase causes a positive threshold voltage shift, and erase trace 85 shows a normal window in which erase causes a negative threshold voltage shift. Negative charge density (−Qigd) and positive charge density (+Qigd) fixed on the IGD cause respectively a normal and reverse transient for program and erase.

Figure 17:
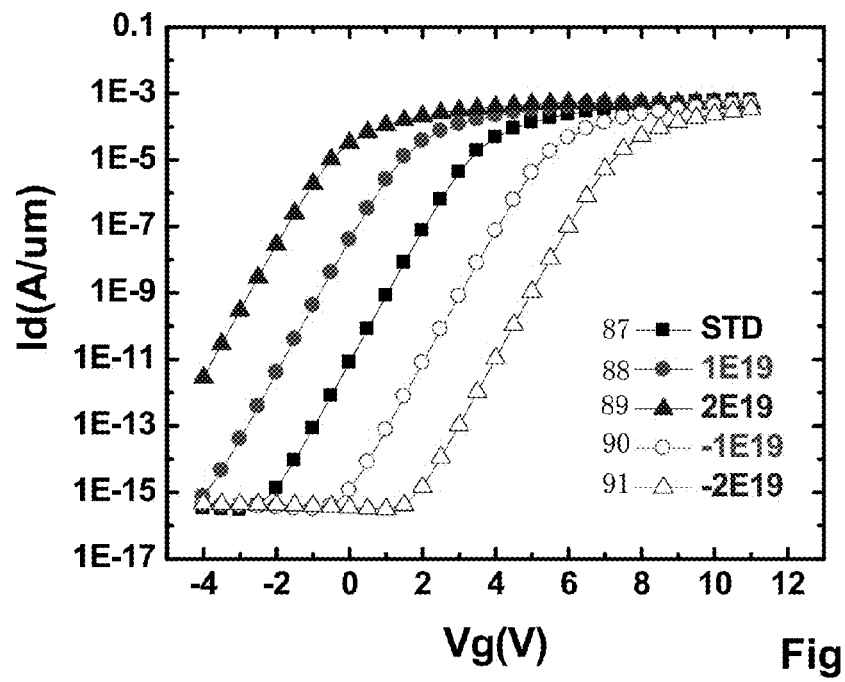
FIG. 17 is a graph of current vs voltage, with various charge densities fixed on the charge trapping layer.

FIG. 17 is a graph of current vs voltage, with various charge densities fixed on the charge trapping layer. The traces 87, 88, 89, 90, and 91 show current vs voltage with charge density (C/um) on the charge trapping layer respectively for no charge, $1 \times 10^{19}$, $2 \times 10^{19}$, $-1 \times 10^{19}$, and $-2 \times 10^{19}$. The trend is that more positive charge densities result in higher current and current saturation at lower gate voltages, and more negative charge densities result in lower current and current saturation at higher gate voltages.

Figure 18:
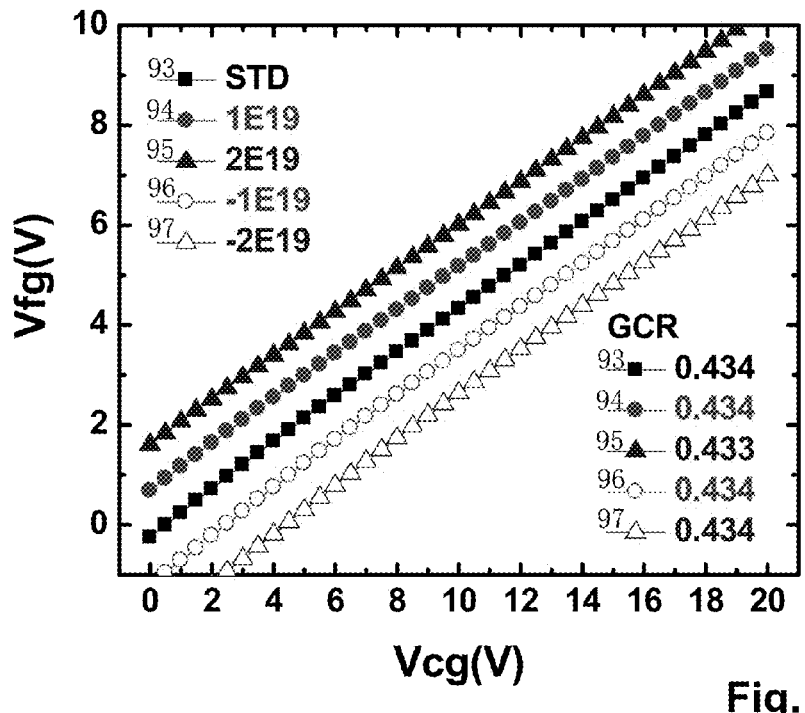
FIG. 18 is a graph of floating gate voltage vs control gate voltage, with various charge densities fixed on the charge trapping layer.

FIG. 18 is a graph of floating gate voltage vs control gate voltage, with various charge densities fixed on the charge trapping layer. The traces 93, 94, 95, 96, and 97 show floating gate voltage vs control gate voltage with charge density (C/um) respectively for no charge, $1 \times 10^{19}$, $2 \times 10^{19}$, $-1 \times 10^{19}$, and $-2 \times 10^{19}$. For all traces, the GCR is the same 0.434, indicating that a varying charge density on the IGD does not change the GCR.

Figure 19:
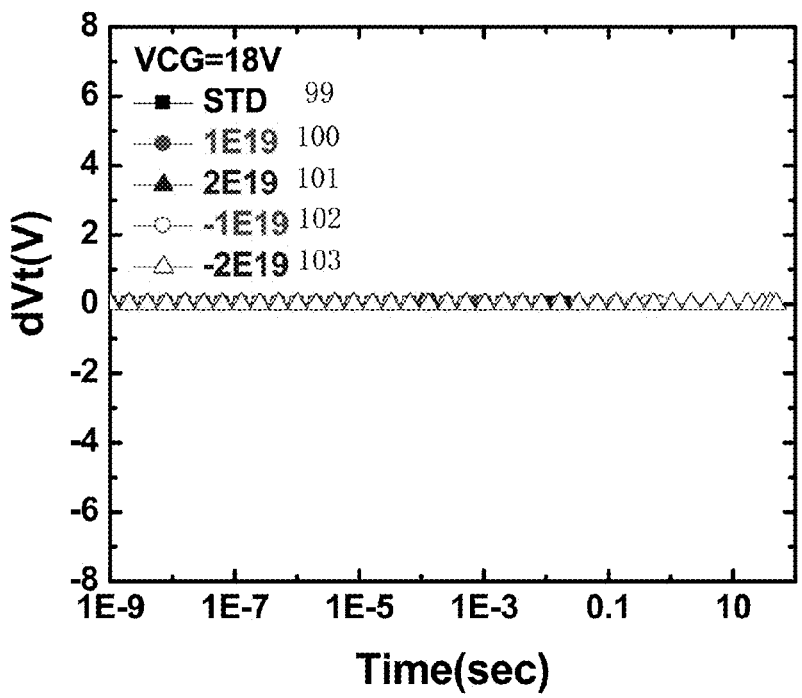
FIG. 19 is a graph of threshold voltage shift for a program operation for various charge densities fixed on the charge trapping layer.

FIG. 19 is a graph of threshold voltage shift for a program operation for various charge densities fixed on the charge trapping layer. When a control gate applies a programming voltage of 18V, the traces 99, 100, 101, 102, and 103 show threshold voltage change with charge density (C/um) on the charge trapping layer respectively for no charge, $1 \times 10^{19}$, $2 \times 10^{19}$, $-1 \times 10^{19}$, and $-2 \times 10^{19}$. All traces are 0.

Figure 20:
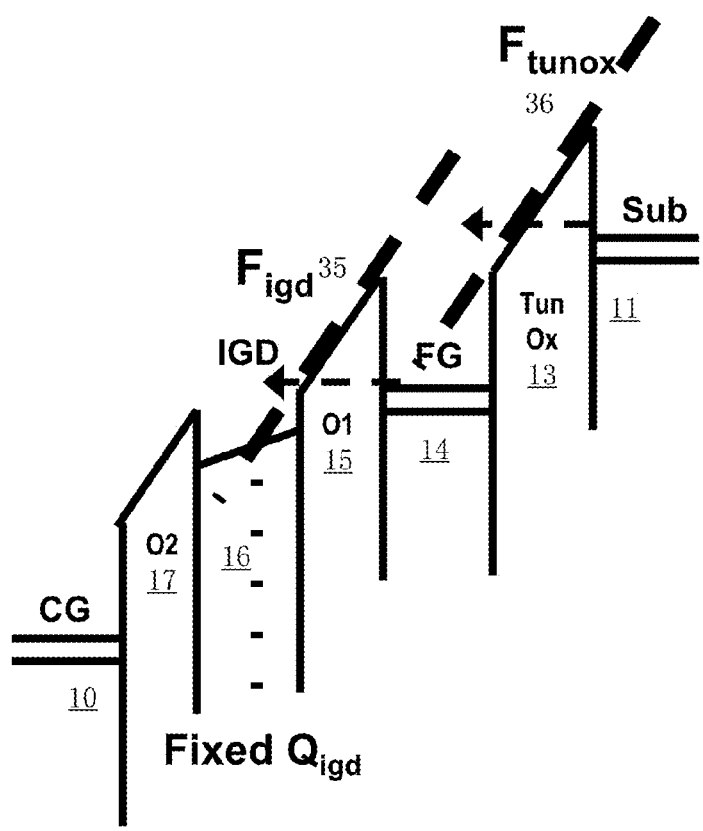
FIG. 20 is a band diagram of a program operation with charge trapping.

FIG. 20 is a band diagram of a program operation with charge trapping.

The band diagram includes, from left to right, control gate 10, O2 17, IGD 16, O1 15, floating gate 14, tunnel oxide 13, and substrate 11. FIG. 20 shows equal electric fields for $F_{igd}$ 35 and $F_{tunox}$ 36, and equal current densities $J_{igd}$ and $J_{tunox}$ through respective oxides.

Applying Gauss's Law, where the divergence of the electric field indicates charge density, due to the equal electric fields $F_{igd}$ 35 and $F_{tunox}$ 36, at steady state, charge density on the floating gate 14 is zero, regardless of charge density on the IGD. The change in threshold voltage from programming is 0. The threshold voltage shift after programming is $-Q_{igd} x/C_{igd}$, where x indicates the ratio of the capacitance for Qfg to that for Qigd.

Figure 21:
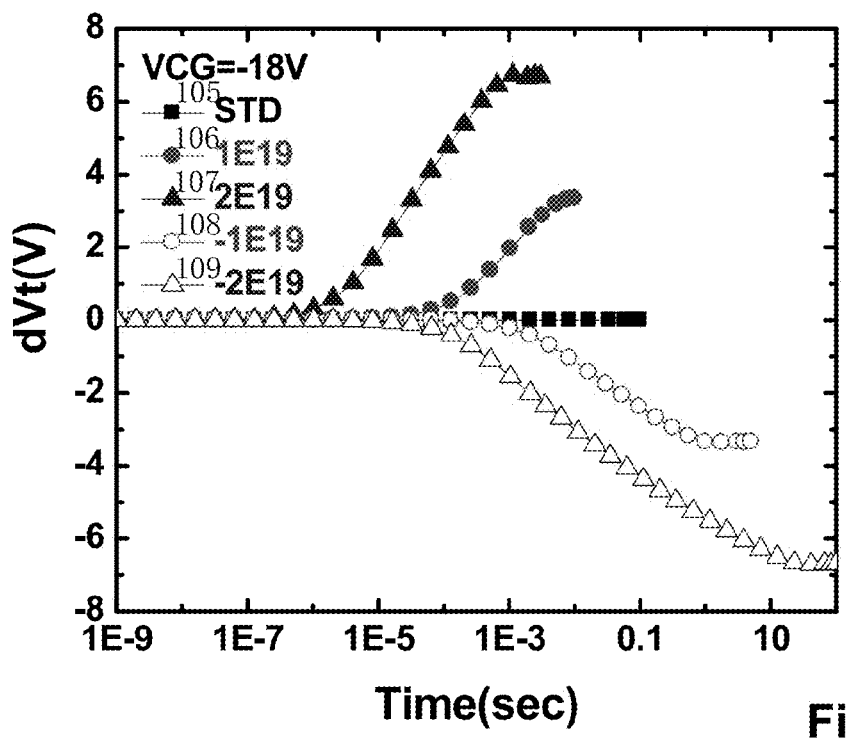
FIG. 21 is a graph of threshold voltage shift for an erase operation for various charge densities fixed on the charge trapping layer.

FIG. 21 is a graph of threshold voltage shift for an erase operation for various charge densities fixed on the charge trapping layer. The traces 105, 106, 107, 108, and 109 show threshold voltage change with charge density (C/um) on the charge trapping layer respectively for no charge, $1 \times 10^{19}$, $2 \times 10^{19}$, $-1 \times 10^{19}$, and $-2 \times 10^{19}$. Only trace 105 for no charge density is 0. The trend is that more positive charge densities result in more positive threshold voltage changes, and more negative charge densities result in more negative threshold voltage changes.

Figure 22:
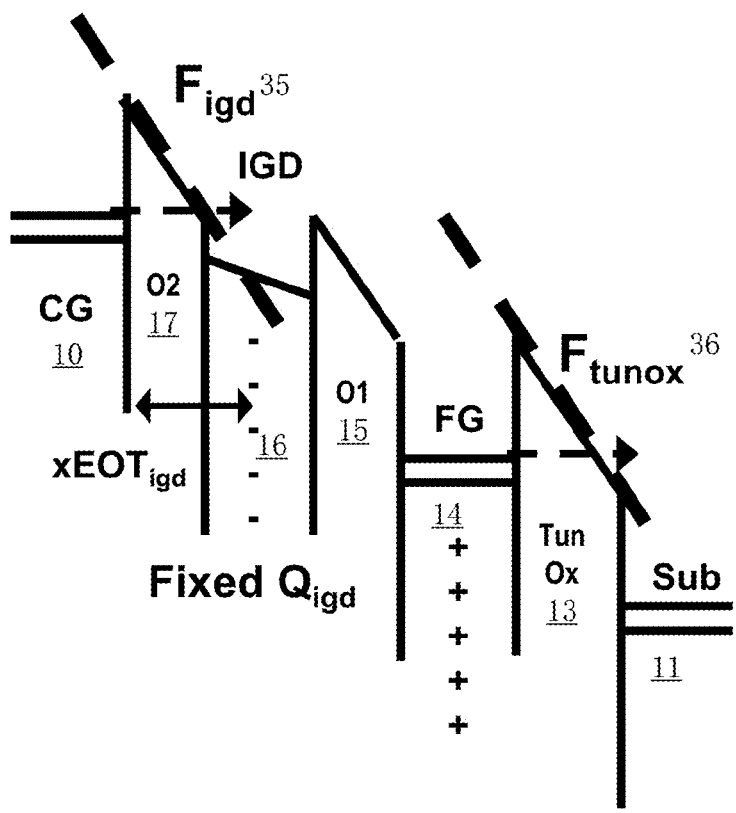
FIG. 22 is a band diagram of an erase operation with charge trapping.

FIG. 22 is a band diagram of an erase operation with charge trapping.

The band diagram includes, from left to right, control gate 10, O2 17, IGD 16, O1 15, floating gate 14, tunnel oxide 13, and substrate 11. FIG. 21 shows equal electric fields for $F_{igd}$ 35 and $F_{tunox}$ 36, and equal current densities $J_{igd}$ and $J_{tunox}$ through respective oxides.

Applying Gauss's Law, where the divergence of the electric field indicates charge density, due to the equal electric fields $F_{igd}$ 35 and $F_{tunox}$ 36, at steady state, the sum of the charge densities on the floating gate 14 and on IGD 16 is zero. So the charge densities on the floating gate 14 and on IGD 16 are equal in magnitude and opposite in sign. The change in threshold voltage from erasing is $-Q_{fg}/C_{igd} = Q_{igd}/C_{igd}$. The threshold voltage shift after erasing is $Q_{igd}(1-x)/C_{igd}$, where x indicates the ratio of the capacitance for Qfg to that for Qigd.

Combining the program and erase results, the program and erase window is $-Q_{igd} C_{igd}$ such that the existence and size of the program and erase window are determined by the charge density on the IGD, which remains fixed during program and erase operations in steady state.

FIGS. 23-28 relate to IGD dynamic trapping, where charge is trapped during program and erase operations, such as an initial program operation prior to regular program and erase operations. The IGD structure with O1/N/O2 has respective thicknesses of 20 A/40 A/60 A. The tunnel oxide has thickness of 70 A. In the program operation the control gate applies 18V.

Figure 23:
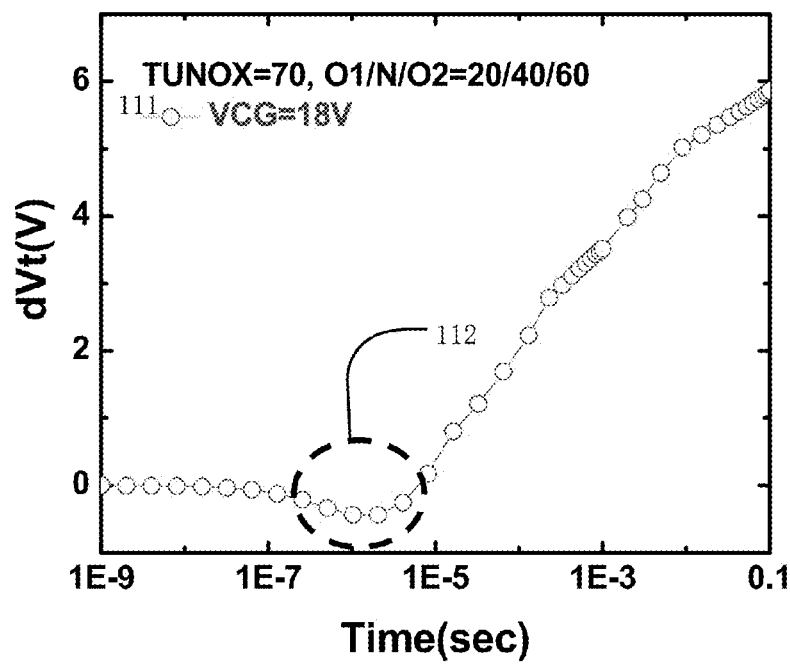
FIG. 23 is a graph of threshold voltage shift for a program operation dynamically adding charge to the charge trapping layer.

FIG. 23 is a graph of threshold voltage shift for a program operation dynamically adding charge to the charge trapping layer.

The voltage change trace 111 starts is 0V, then dips into a region 112 of slightly negative voltage ("reverse" window), and then rises into increasingly positive voltages. The PGM window opens increasingly wider.

Figure 24:
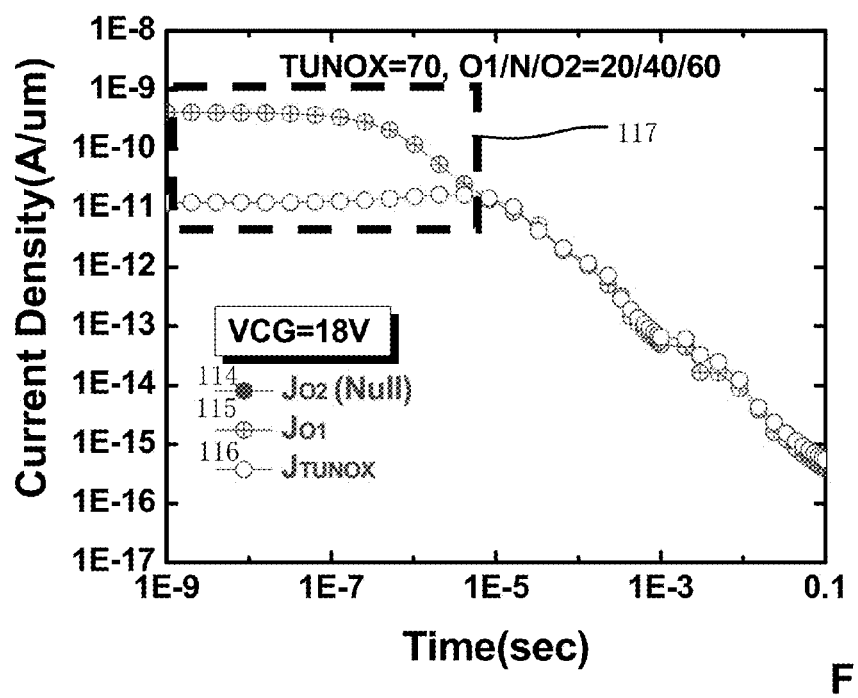
FIG. 24 is a graph of current density at various oxide layers for a program operation.

FIG. 24 is a graph of current density at various oxide layers for a program operation.

Trace 114 for current density $J_{O2}$ is zero. In region 117, trace 115 for outgoing current density $J_{O1}$ begins at a higher value than trace 116 for incoming current density $J_{TUNOX}$. This difference in current densities results in the "reverse window" 112 in FIG. 23. After region 117, trace 115 for outgoing current density $J_{O1}$ equals trace 116 for incoming current density $J_{TUNOX}$ and steadily falls.

Figure 25:
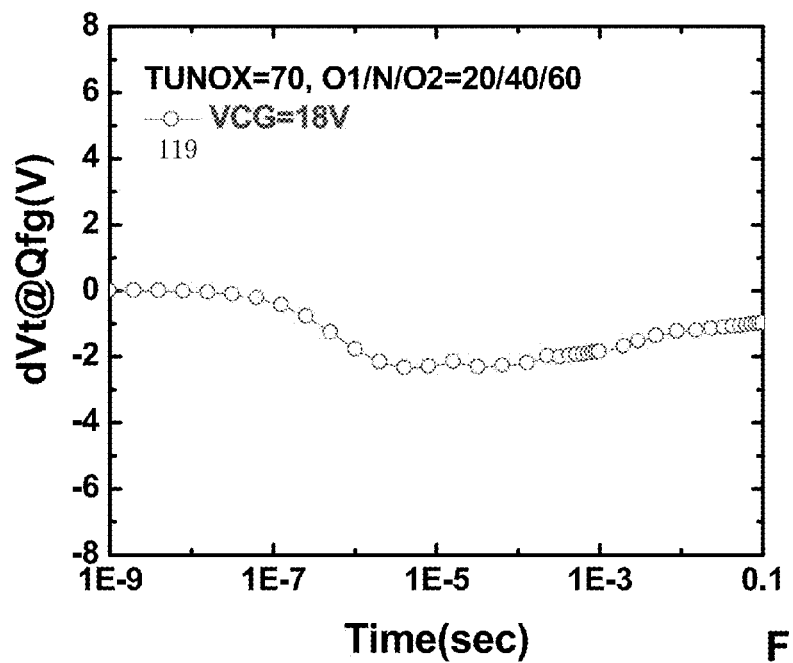
FIG. 25 is a graph of voltage shift at the floating gate for a program operation dynamically adding charge to the charge trapping layer.

FIG. 25 is a graph of voltage shift at the floating gate for a program operation dynamically adding charge to the charge trapping layer.

The voltage shift 119 at the floating gate becomes slightly negative and then returns partly towards 0.

Figure 26:
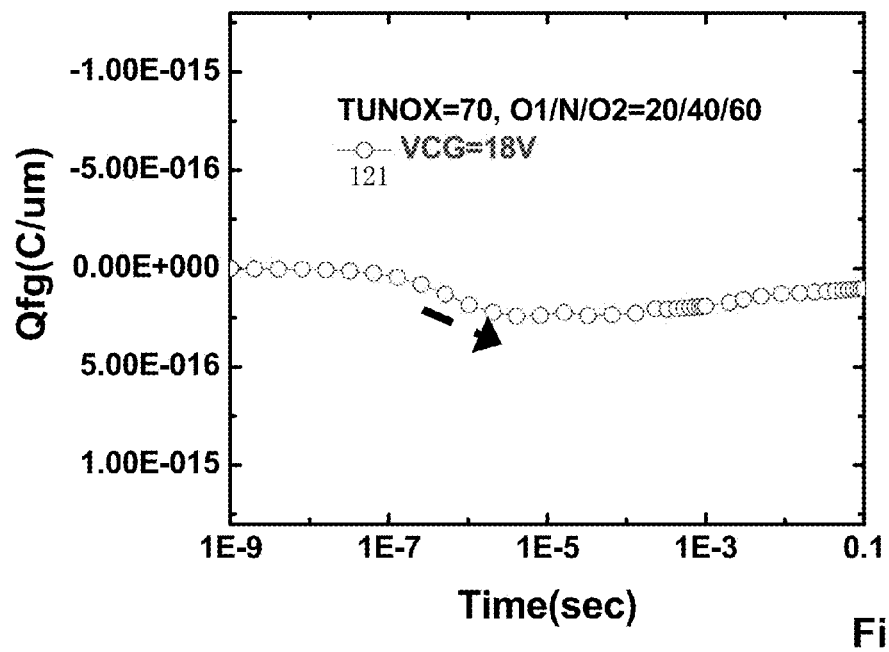
FIG. 26 is a graph of charge density at the floating gate for a program operation dynamically adding charge to the charge trapping layer.

FIG. 26 is a graph of charge density at the floating gate for a program operation dynamically adding charge to the charge trapping layer.

The charge density 121 on the floating gate becomes slightly positive and then remains substantially constant, as the outgoing current density $J_{O1}$ equals the incoming current density $J_{TUNOX}$ per FIG. 24.

Figure 27:
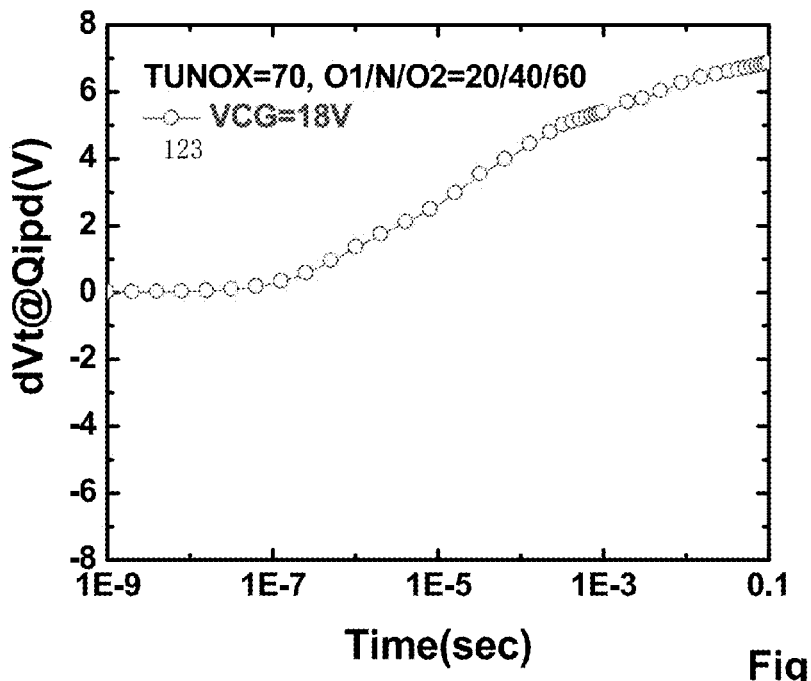
FIG. 27 is a graph of voltage shift at the charge trapping layer for a program operation dynamically adding charge to the charge trapping layer.

FIG. 27 is a graph of voltage shift at the charge trapping layer for a program operation dynamically adding charge to the charge trapping layer.

The voltage shift 123 at the IPD becomes increasingly positive.

Figure 28:
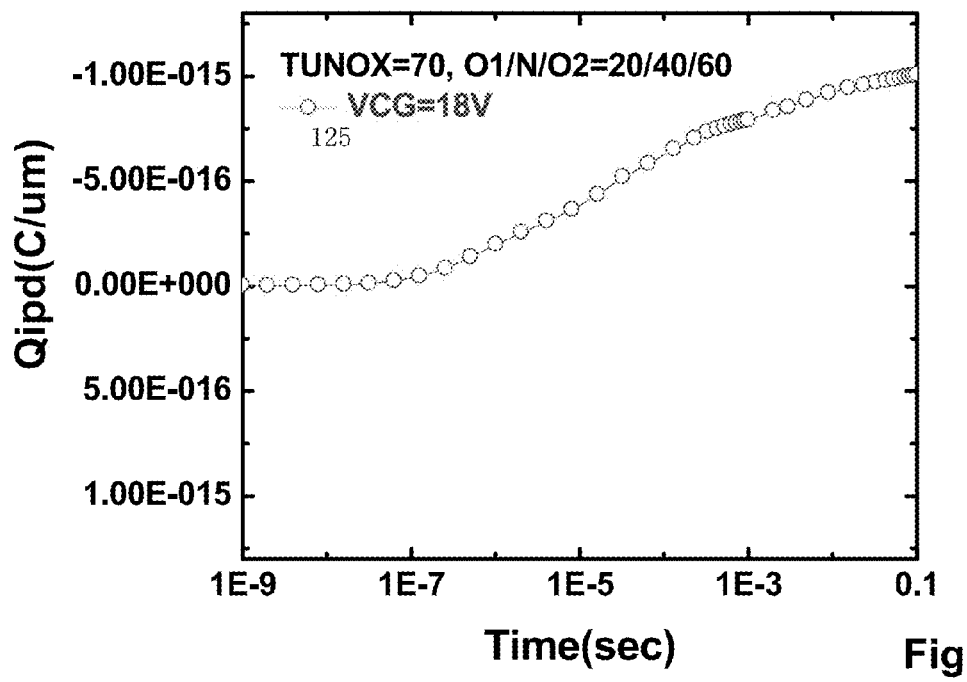
FIG. 28 is a graph of charge density at the charge trapping layer for a program operation dynamically adding charge to the charge trapping layer.

FIG. 28 is a graph of charge density at the charge trapping layer for a program operation dynamically adding charge to the charge trapping layer.

The charge density 125 on the IPD becomes increasingly positive, as the outgoing current density $J_{O2}$ is zero and the incoming current density $J_{O1}$ is nonzero.

FIGS. 29-34 relate to IGD dynamic trapping, where charge is trapped during program and erase operations, such as an initial erase operation prior to regular program and erase operations. The IGD structure with O1/N/O2 has respective thicknesses of 20 A/40 A/60 A. The tunnel oxide has thickness of 70 A. In the erase operation the control gate applies −18V.

Figure 29:
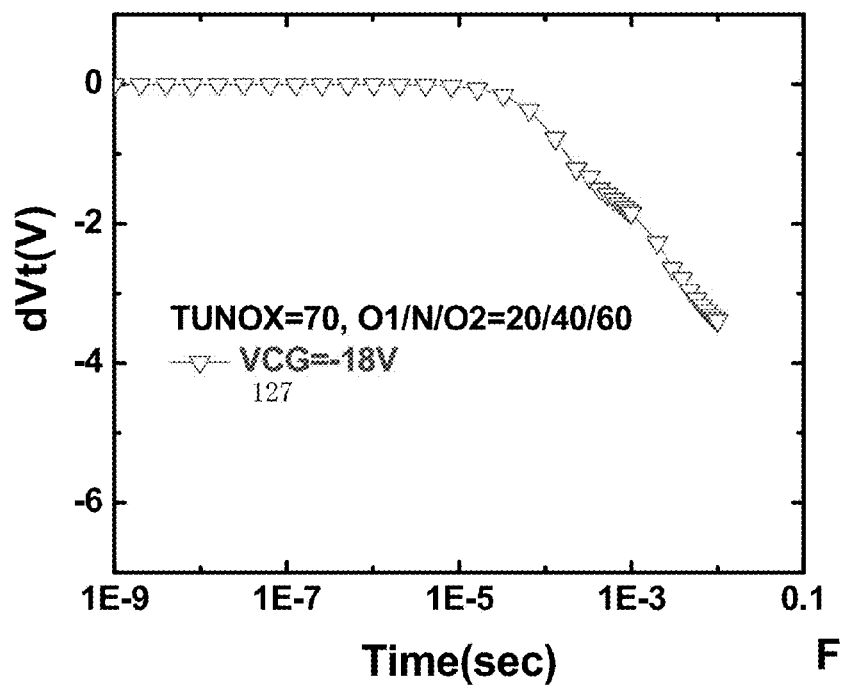
FIG. 29 is a graph of threshold voltage shift for an erase operation dynamically adding charge to the charge trapping layer.

FIG. 29 is a graph of threshold voltage shift for an erase operation dynamically adding charge to the charge trapping layer.

The voltage change trace 127 starts as 0V, and then drops into increasingly negative voltages. The ERS window opens increasingly wider.

Figure 30:
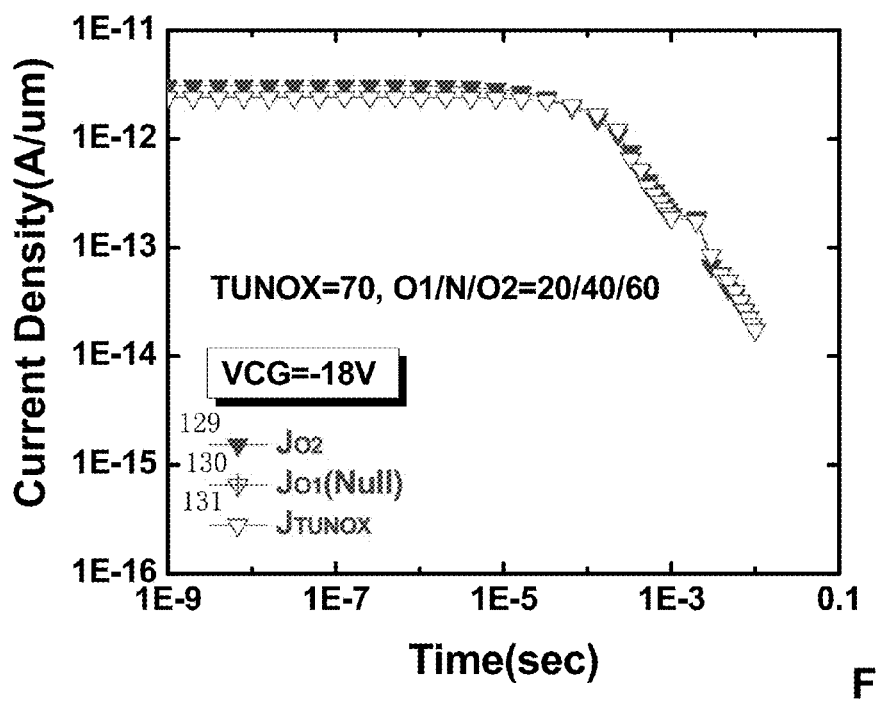
FIG. 30 is a graph of current density at various oxide layers for an erase operation.

FIG. 30 is a graph of current density at various oxide layers for an erase operation.

Trace 130 for current density $J_{O1}$ is zero. Trace 129 for current density $J_{O2}$ equals trace 131 for current density $J_{TUNOX}$. Both O2 and tunneling oxide have thicknesses of at least 60 A, such that the carrier injection mechanism are both FN tunneling.

Figure 31:
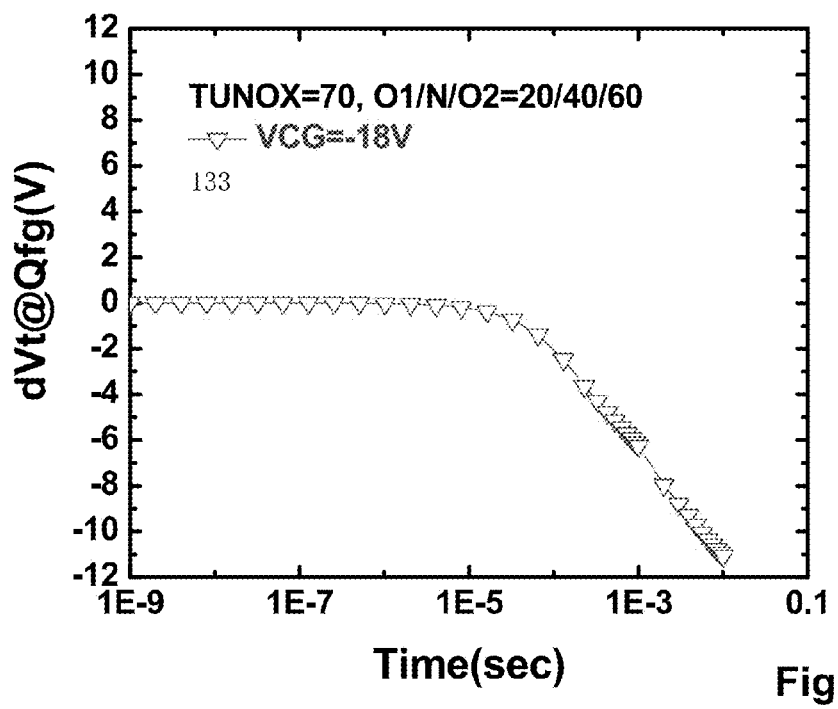
FIG. 31 is a graph of voltage shift at the floating gate for an erase operation dynamically adding charge to the charge trapping layer.

FIG. 31 is a graph of voltage shift at the floating gate for an erase operation dynamically adding charge to the charge trapping layer.

The voltage shift 133 at the floating gate starts level at 0 and then becomes increasingly negative.

Figure 32:
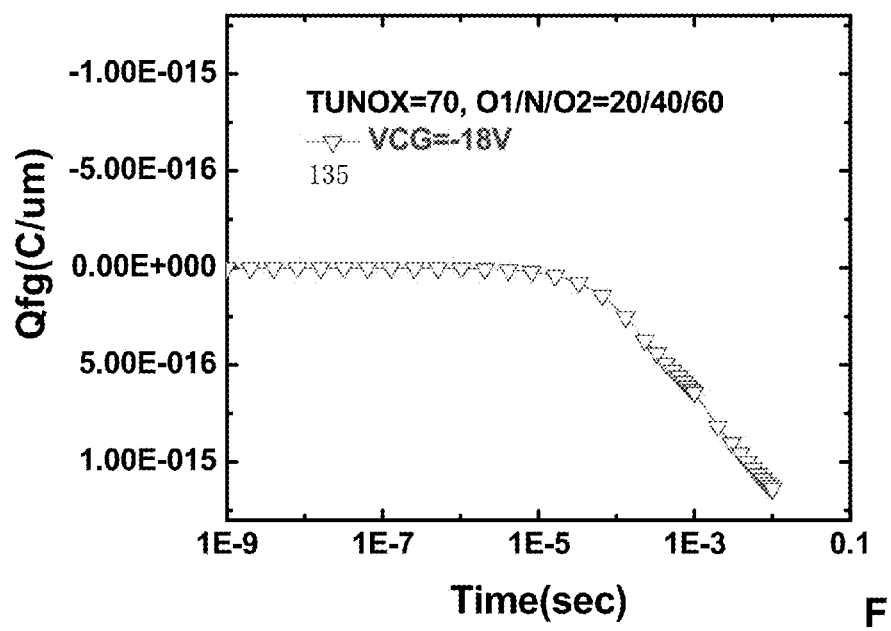
FIG. 32 is a graph of charge density at the floating gate for an erase operation dynamically adding charge to the charge trapping layer.

FIG. 32 is a graph of charge density at the floating gate for an erase operation dynamically adding charge to the charge trapping layer.

The charge density 135 on the floating gate starts level at 0 and then becomes increasingly positive.

Figure 33:
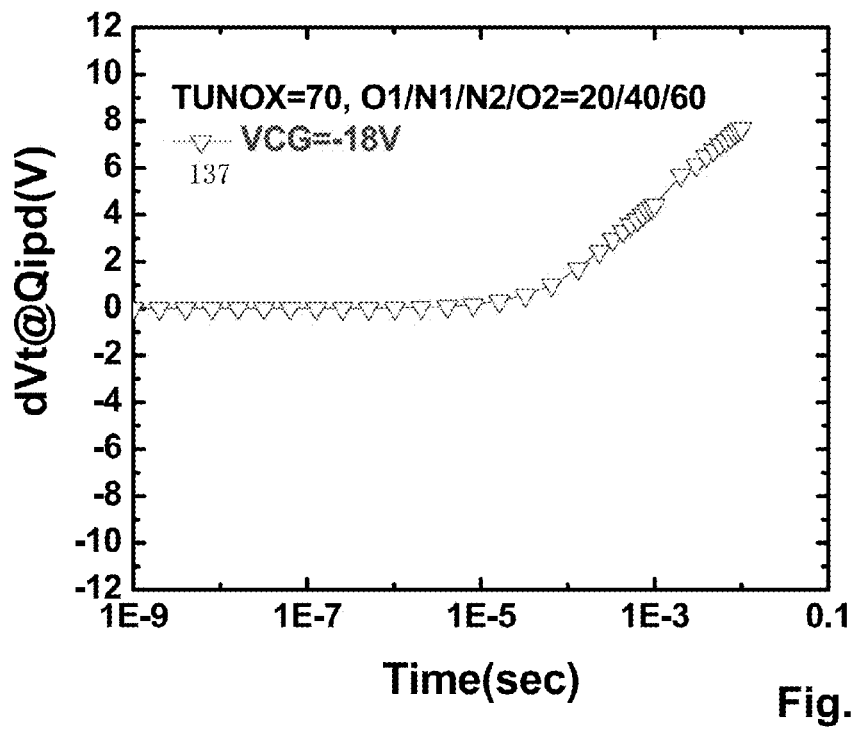
FIG. 33 is a graph of voltage shift at the charge trapping layer for an erase operation dynamically adding charge to the charge trapping layer.

FIG. 33 is a graph of voltage shift at the charge trapping layer for an erase operation dynamically adding charge to the charge trapping layer.

The voltage shift 137 at the IPD starts level at 0 becomes increasingly positive. The distance to the control gate is less for the IPD than for the floating gate, which results in a larger weighting for the negative voltage shift at the floating gate than for the positive voltage shift at the IPD.

Figure 34:
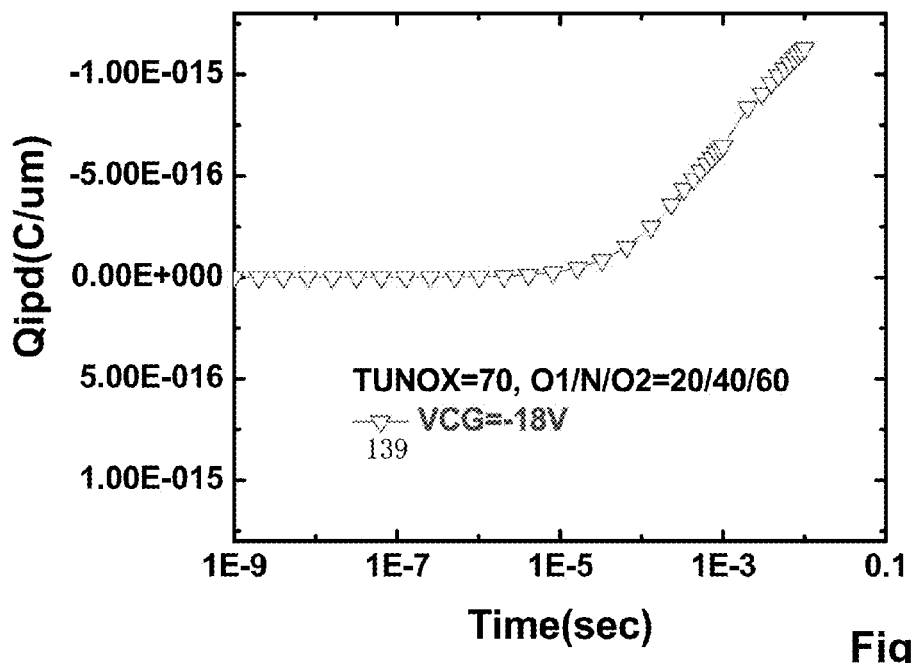
FIG. 34 is a graph of charge density at the charge trapping layer for an erase operation dynamically adding charge to the charge trapping layer.

FIG. 34 is a graph of charge density at the charge trapping layer for an erase operation dynamically adding charge to the charge trapping layer.

The charge density 139 on the IPD starts level at 0 and then becomes increasingly negative. The charge densities 135 and 139 are equal in magnitude an opposite in sign.

FIGS. 35-37 are graphs of threshold voltage showing program and erase cycle behavior, respectively showing in sequence an initial program operation, a subsequent erase operation, and then another program operation. Because the operations are consecutive, the ending threshold voltage of a preceding figure is the beginning threshold voltage of the following figure.

In FIG. 35, trace 141 shows the threshold voltage for an initial program operation, preceding any other program or erase operations. The IGD structure with O1/N/O2 has respective thicknesses of 20 A/40 A/60 A. The tunnel oxide has thickness of 70 A. The control gate applies a program voltage of 18V. Trace 141 shows an increase in the threshold voltage due to an increase in the negative charge density on the IPD $Q_{ipd}$.

In FIG. 36, trace 143 shows the threshold voltage for an erase operation subsequent to the program operation in FIG. 35. The control gate applies an erase voltage of −18V. Trace 143 shows a decrease in the threshold voltage due to an increase in the positive charge density on the floating gate $Q_{fg}$. The erase ends where the solid triangles end.

In an alternative erase, the erase continues past the point where the solid triangles end as shown by empty triangles. In the alternative erase, the threshold voltage continues to decrease down to negative voltage, due to an increase in the positive charge density on the floating gate $Q_{fg}$, accompanied by an increase in the negative charge density on the IPD $Q_{ipd}$.

In FIG. 37, trace 145 shows the threshold voltage for a program operation subsequent to the erase operation in FIG. 36. The control gate applies a program voltage of 18V. Trace 145 shows an increase in the threshold voltage due to a decrease in the positive charge density on the floating gate $Q_{fg}$. The program ends where the solid circles end.

In an alternative program, the program continues past the point where the solid circles end as shown by empty circles, and beyond the final threshold voltage in FIG. 35. In the alternative program, the threshold voltage continues to increase beyond the final threshold voltage in FIG. 35, due to an increase in the negative charge density on the IPD $Q_{ipd}$.

FIGS. 38-40 are graphs of threshold voltage showing program and erase cycle behavior, respectively showing in sequence an initial erase operation, a subsequent program operation, and then another erase operation. Because the operations are consecutive, the ending threshold voltage of a preceding figure is the beginning threshold voltage of the following figure.

In FIG. 38, trace 147 shows the threshold voltage for an initial erase operation, preceding any other program or erase operations. The IGD structure with O1/N/O2 has respective thicknesses of 20 A/40 A/60 A. The tunnel oxide has thickness of 70 A. The control gate applies an erase voltage of −18V. Trace 147 shows a decrease in the threshold voltage due to an increase in the positive charge density on the floating gate $Q_{fg}$, accompanied by an increase in the negative charge density on the IPD $Q_{ipd}$.

In FIG. 39, trace 149 shows the threshold voltage for a program operation subsequent to the erase operation in FIG. 38. The control gate applies a program voltage of 18V. Trace 149 shows an increase in the threshold voltage due to a decrease in the positive charge density on the floating gate $Q_{fg}$. The program ends where the solid circles end.

In an alternative program, the program continues past the point where the solid circles end as shown by empty circles. In the alternative erase, the threshold voltage continues to increase, due to an increase in the negative charge density on the IPD $Q_{ipd}$.

In FIG. 40, trace 151 shows the threshold voltage for an erase operation subsequent to the program operation in FIG. 39. The control gate applies an erase voltage of −18V. Trace 151 shows a decrease in the threshold voltage due to an increase in the positive charge density on the floating gate $Q_{fg}$. The program ends where the solid triangles end.

In an alternative erase, the erase continues past the point where the solid triangles end as shown by empty triangles, and beyond the final threshold voltage in FIG. 38. In the alternative program, the threshold voltage continues to decrease beyond the final threshold voltage in FIG. 38 and down to negative voltage, due to an increase in the positive charge density on the floating gate $Q_{fg}$, accompanied by an increase in the negative charge density on the IPD $Q_{ipd}$.

The program and erase cycle behavior shows that an initial program operation or initial erase operation determines the charge density on the IPD for subsequent program and erase operations. However, another program or erase operation subsequent to the initial program operation or initial erase operation can also increase the charge density magnitude on the IPD for subsequent program and erase operations. This occurs when an erase operation has a bias magnitude and/or bias duration that exceeds the initial erase operation, or when a program operation has a bias magnitude and/or bias duration that exceeds the initial program operation. The new bias magnitude and/or bias duration become the new floor to be exceeded in order to increase further the charge density magnitude on the IPD in any subsequent program and erase operations. In any subsequent program and erase operations that do not exceed this floor, the charge density magnitude on the IPD remains substantially constant.

Figure 41:
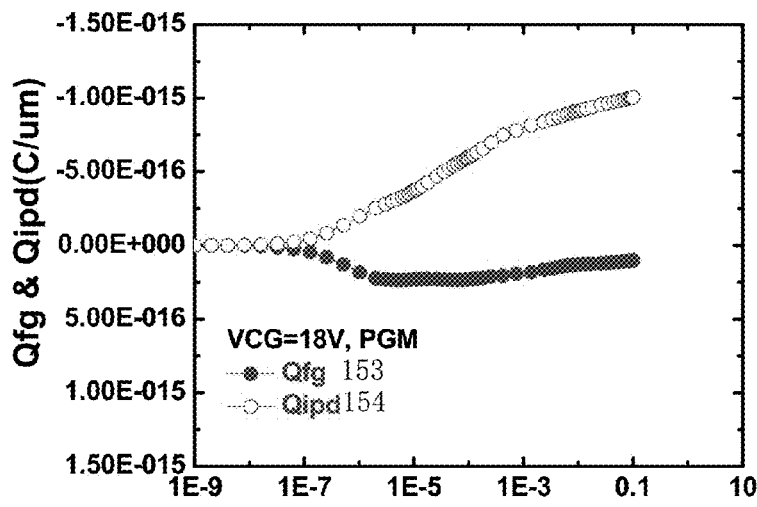
FIGS. 41-43 are graphs of charge density on the floating gate and charge trapping layer showing program and erase cycle behavior, respectively showing in sequence an initial program operation, a subsequent erase operation, and then another program operation.
Figure 42:
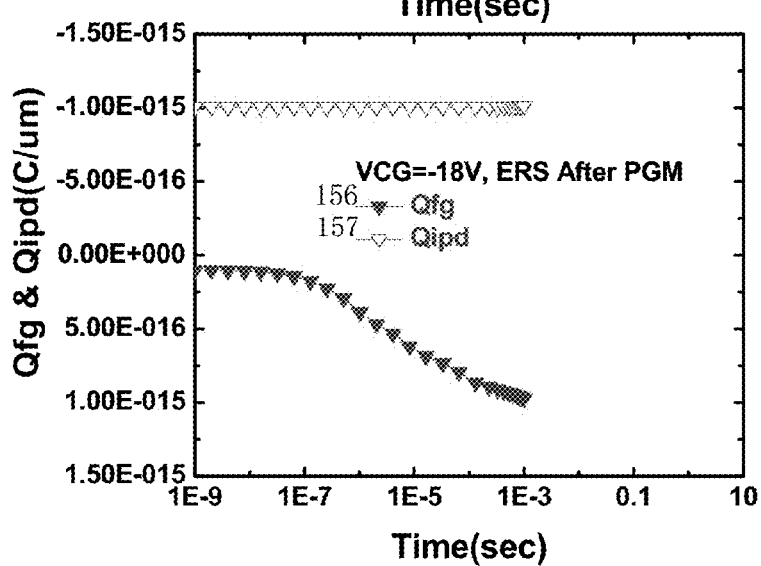
Figure 43:
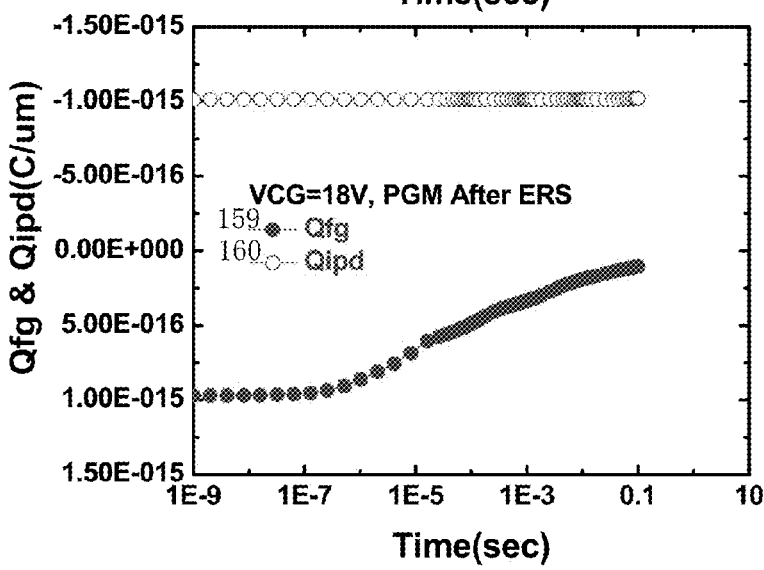

FIGS. 41-43 are graphs of charge density on the floating gate and charge trapping layer showing program and erase cycle behavior, respectively showing in sequence an initial program operation, a subsequent erase operation, and then another program operation. Because the operations are consecutive, the ending charge density of a preceding figure is the beginning charge density of the following figure.

In FIG. 41, traces 153 and 154 shows the charge density on the floating gate and IPD respectively for an initial program operation, preceding any other program or erase operations. The IGD structure with O1/N/O2 has respective thicknesses of 20 A/40 A/60 A. The tunnel oxide has thickness of 70 A. The control gate applies a program voltage of 18V. Trace 154 shows an increase in the negative charge density on the IPD $Q_{ipd}$, resulting in an increase in the threshold voltage. Trace 153 shows a slight increase in the positive charge density on the floating gate $Q_{fg}$.

In FIG. 42, trace 156 and 157 show the charge density on the floating gate and IPD respectively for an erase operation subsequent to the program operation in FIG. 41. The control gate applies an erase voltage of −18V. Trace 156 shows an increase in the positive charge density on the floating gate $Q_{fg}$, resulting in a decrease in threshold voltage. Trace 157 shows a substantially constant negative charge density on the IPD $Q_{ipd}$.

In FIG. 43, traces 159 and 160 show the charge density on the floating gate and IPD respectively for a program operation subsequent to the erase operation in FIG. 42. The control gate applies a program voltage of 18V. Trace 159 shows a decrease in the positive charge density on the floating gate $Q_{fg}$, resulting in an increase in the threshold voltage. Trace 160 shows a substantially constant negative charge density on the IPD $Q_{ipd}$.

Figure 44:
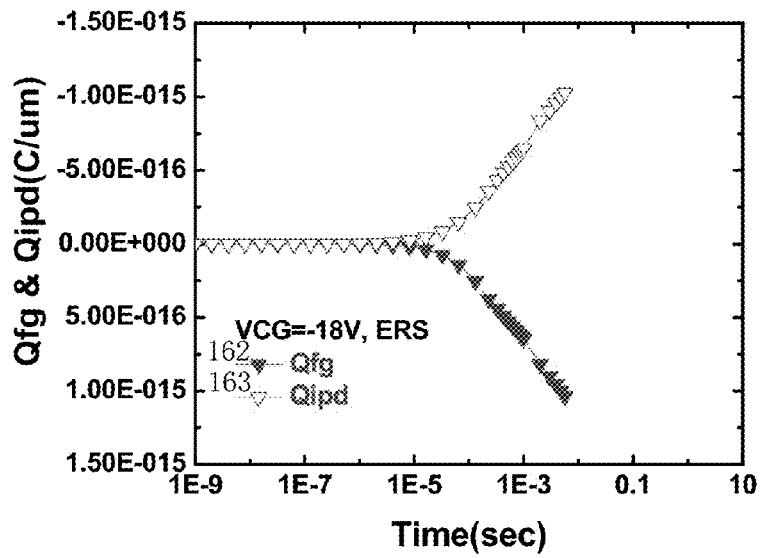
FIGS. 44-46 are graphs of charge density on the floating gate and charge trapping layer showing program and erase cycle behavior, respectively showing in sequence an initial erase operation, a subsequent program operation, and then another erase operation.
Figure 45:
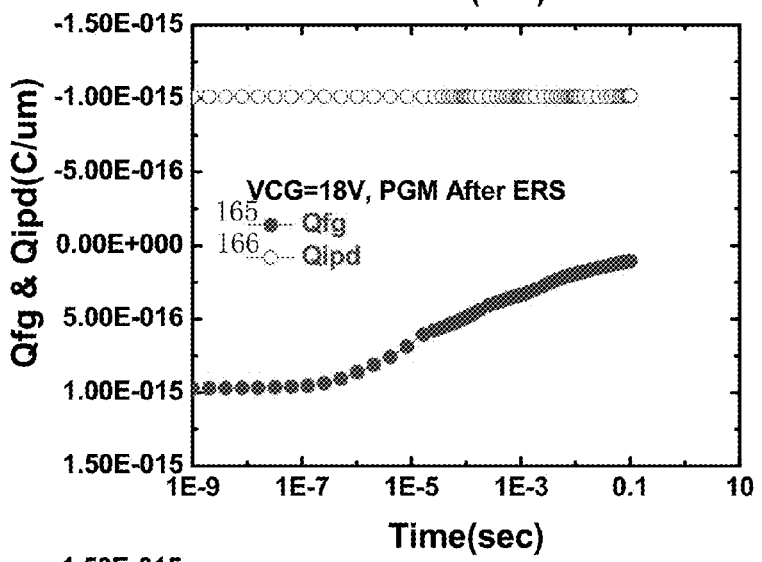
Figure 46:
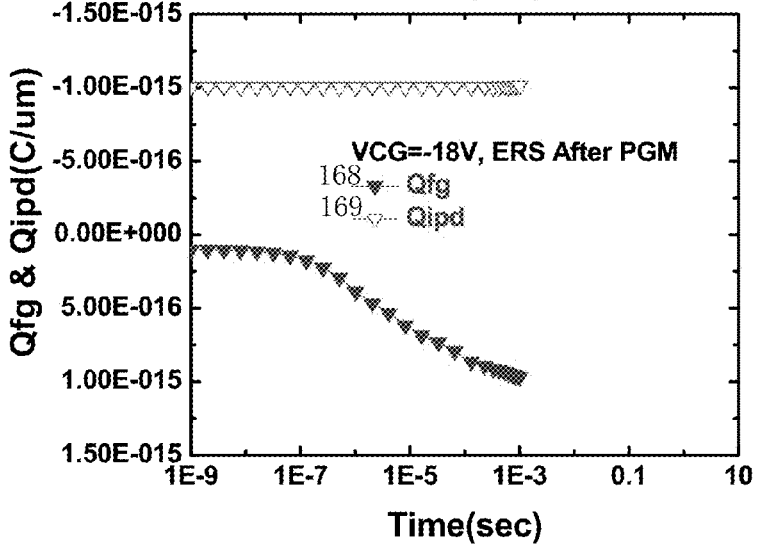

FIGS. 44-46 are graphs of charge density on the floating gate and charge trapping layer showing program and erase cycle behavior, respectively showing in sequence an initial erase operation, a subsequent program operation, and then another erase operation. Because the operations are consecutive, the ending charge density of a preceding figure is the beginning charge density of the following figure.

In FIG. 44, traces 162 and 163 show the charge density on the floating gate and IPD respectively for an initial erase operation, preceding any other program or erase operations. The IGD structure with O1/N/O2 has respective thicknesses of 20 A/40 A/60 A. The tunnel oxide has thickness of 70 A. The control gate applies an erase voltage of −18V. Trace 162 shows an increase in the positive charge density on the floating gate $Q_{fg}$, resulting in a decrease in the threshold voltage. Trace 163 shows an increase in the negative charge density on the IPD $Q_{ipd}$.

In FIG. 45, traces 165 and 166 show the charge density on the floating gate and IPD respectively for a program operation subsequent to the erase operation in FIG. 44. The control gate applies a program voltage of 18V. Trace 165 shows a decrease in the positive charge density on the floating gate $Q_{fg}$, resulting in an increase in the threshold voltage. Trace 166 shows a substantially constant negative charge density on the IPD $Q_{ipd}$.

In FIG. 46, traces 168 and 169 show the charge density on the floating gate and IPD respectively for an erase operation subsequent to the program operation in FIG. 45. The control gate applies an erase voltage of −18V. Trace 168 shows an increase in the positive charge density on the floating gate $Q_{fg}$, resulting in a decrease in the threshold voltage. Trace 169 shows a substantially constant negative charge density on the IPD $Q_{ipd}$.

The program and erase cycle behavior shows again that an initial program operation or initial erase operation determines the charge density on the IPD for subsequent program and erase operations.

Figure 47:
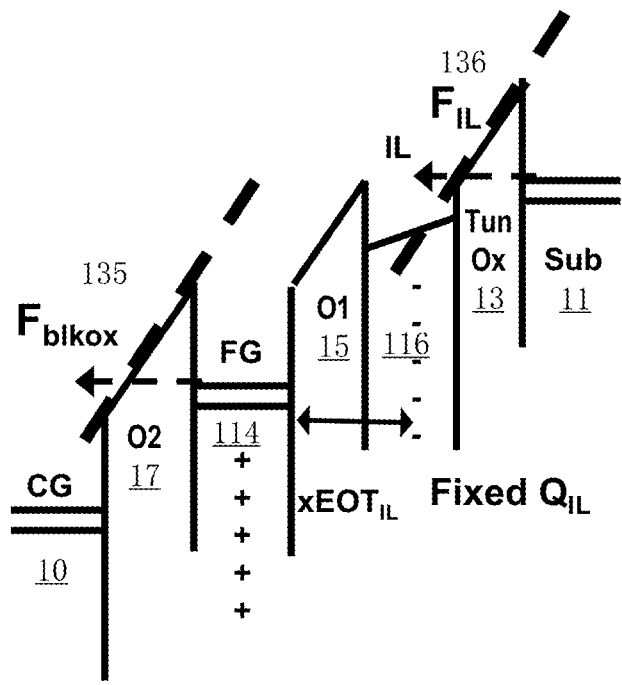
FIG. 47 is an alternative band diagram of a program operation with charge trapping.

FIG. 47 is an alternative band diagram of a program operation with charge trapping.

The band diagram includes, from left to right, control gate 10, O2 17, floating gate 114, O1 15, IL (intermediate layer) 116, tunnel oxide 13, and substrate 11. FIG. 47 shows equal electric fields for $F_{IL}$ 136 and $F_{blkox}$ 135, and equal current densities $J_{IL}$ and $J_{blkox}$ through respective oxides. The IL can be made of the same material and variants as a charge trapping layer, and have the same thickness ranges.

Applying Gauss's Law, where the divergence of the electric field indicates charge density, due to the equal electric fields $F_{IL}$ 136 and $F_{blkox}$ 135, at steady state, the sum of the charge densities on the floating gate 114 and on IGD 116 is zero. So the charge densities on the floating gate 114 and on IL 116 are equal in magnitude and opposite in sign. The change in threshold voltage from erasing is $-Q_{fg}/C_{blkox}=Q_{IL}/C_{blkox}$. The threshold voltage after programming is $Q_{IL}(x/C_{IL}+1/C_{blkox})-(Q_{IL}/C_{blkox})=Q_{IL}(x/C_{IL})$, where x indicates the ratio of CIL to the effective capacitance for QIL.

Figure 48:
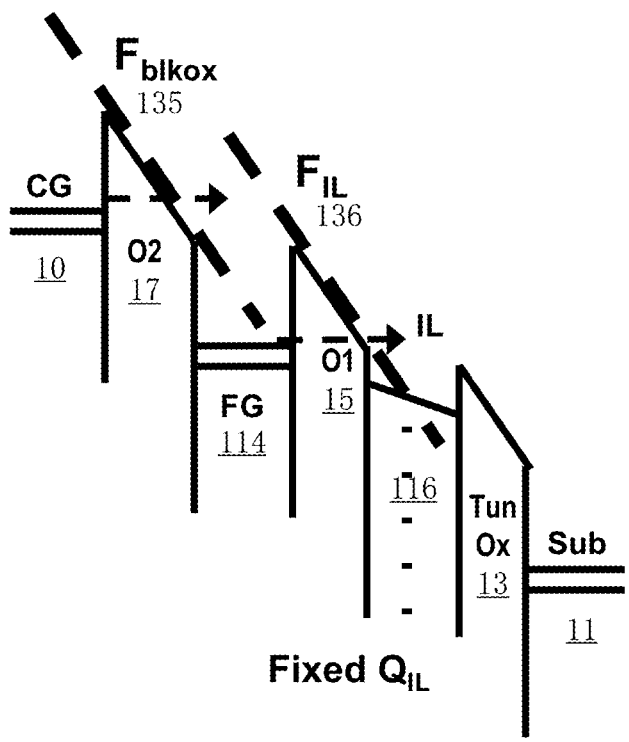
FIG. 48 is an alternative band diagram of an erase operation with charge trapping.

FIG. 48 is an alternative band diagram of an erase operation with charge trapping.

The band diagram includes, from left to right, control gate 10, O2 17, floating gate 114, O1 15, IL (intermediate layer) 116, tunnel oxide 13, and substrate 11. FIG. 48 shows equal electric fields for $F_{IL}$ 136 and $F_{blkox}$ 135, and equal current densities $J_{IL}$ and $J_{blkox}$ through respective oxides.

Applying Gauss's Law, where the divergence of the electric field indicates charge density, due to the equal electric fields $F_{IL}$ 136 and $F_{blkox}$ 135, at steady state, charge density on the floating gate 14 is zero, regardless of charge density on the IL. The change in threshold voltage from erase is 0. The threshold voltage after erase is $Q_{IL}(x/C_{IL}+1/C_{blkox})$, where x indicates the ratio of $C_{IL}$ to the effective capacitance for $Q_{IL}$. Combining the program and erase results, the program and erase window is $-Q_{IL}/C_{blkox}$ such that the existence and size of the program and erase window are determined by the charge density on the IL, remaining fixed or substantially constant during program and erase operations in steady state.

The structure of the memory cell in FIGS. 47 and 48 is similar to the structure of the memory cell in FIGS. 20 and 22, except that the IGD/IPD and floating gate switch positions.

Figure 49:
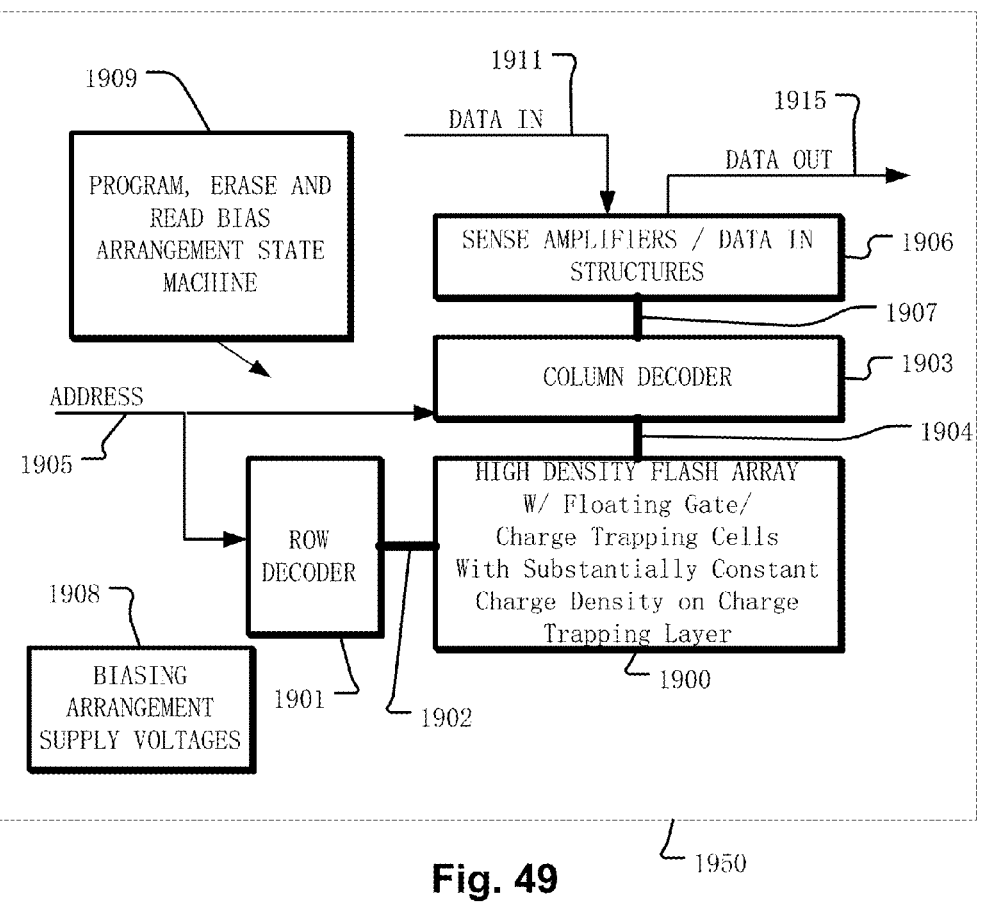
FIG. 49 is a simplified diagram in accordance with one embodiment of an integrated circuit with an array of charge trapping floating gate CTFG memory cells and control circuitry, with a substantially constant charge density on the charge trapping layer during regular operation after charging of the charge trapping layer.

FIG. 49 is a simplified diagram in accordance with one embodiment of an integrated circuit with an array of charge trapping floating gate CTFG memory cells and control circuitry, with a substantially constant charge density on the charge trapping layer during regular operation after charging of the charge trapping layer.

The integrated circuit 1950 includes a memory array 1900 implemented using non-volatile CTFG memory cells, as described herein, on a semiconductor substrate. The memory cells of array 1900 may be interconnected in parallel, in series, or in a virtual ground array. A row decoder 1901 is coupled to a plurality of wordlines 1902 arranged along rows in the memory array 1900. Memory cells as described herein can be configured in NAND arrays, and NOR arrays, or other types of array structures. A column decoder 1903 is coupled to a plurality of bitlines 1904 arranged along columns in the memory array 1900. Addresses are supplied on bus 1905 to column decoder 1903 and row decoder 1901. Sense amplifiers and data-in structures in block 1906 are coupled to the column decoder 1903 via data bus 1907. Data is supplied via the data-in line 1911 from input/output ports on the integrated circuit 1950, or from other data sources internal or external to the integrated circuit 1950, to the data-in structures in block 1906. Data is supplied via the data-out line 1915 from the sense amplifiers in block 1906 to input/output ports on the integrated circuit 1950, or to other data destinations internal or external to the integrated circuit 1950. A bias arrangement state machine 1909 controls the application of bias arrangement supply voltages 1908, such as for the erase verify and program verify voltages, and the arrangements for programming, erasing, and reading the memory cells. The array may be combined on the integrated circuit with other modules, such as processors, other memory arrays, programmable logic, dedicated logic etc.

While the present invention is disclosed by reference to the preferred embodiments and examples detailed above, it is to be understood that these examples are intended in an illustrative rather than a limiting sense. It is to be understood and appreciated that that the fabrication steps and structures described herein do not cover a complete process flow for the manufacture of entire integrated circuits. The present invention may be practiced in conjunction with various integrated circuit fabrication techniques that are known in the art or to be developed. It is contemplated that modifications and combinations will readily occur to those skilled in the art, which modifications and combinations will be within the spirit of the invention and the scope of the following claims.

What is claimed is:

1. A method comprising:
controlling program and erase operations on a nonvolatile memory cell, by changing a first charge density on a floating gate in the nonvolatile memory cell by a larger magnitude than a second charge density on a charge trapping dielectric layer in the nonvolatile memory cell, the floating gate and the charge trapping dielectric layer both planar.

2. The method of claim 1, further comprising:
the program operations raising a threshold voltage of the nonvolatile memory cell, by changing the first charge density to become more negative from a net positive charge density value.

3. The method of claim 1, further comprising:
the erase operations lowering a threshold voltage of the nonvolatile memory cell, by changing the first charge density to become more positive to a net positive charge density value.

4. The method of claim 1, further comprising:
preceding any of the program and erase operations, changing an initial state of the nonvolatile memory cell such that the charge trapping dielectric layer has the second charge density with an initial program operation.

5. The method of claim 1, further comprising:
preceding any of the program and erase operations, changing an initial state of the nonvolatile memory cell such that the charge trapping dielectric layer has the second charge density with an initial erase operation.

6. The method of claim 1, further comprising:
preceding any of the program and erase operations, performing an initial program operation on the nonvolatile memory cell, resulting in a negative charge density on the charge trapping dielectric layer and a nonnegative charge density on the floating gate.

7. The method of claim 1, further comprising:
performing an initial erase operation on the nonvolatile memory operation, resulting in a negative charge density on the charge trapping dielectric layer and a positive charge density on the floating gate.

8. The method of claim 1, wherein the nonvolatile memory cell includes:
a semiconductor substrate having a surface with a source region and a drain region in the substrate and separated by a channel region;
a multilayer stack over the channel region including a first tunneling barrier structure disposed on the surface of the substrate above the channel region, the floating gate disposed above the first tunneling barrier structure and above the channel region, and the charge trapping dielectric layer above the floating gate and above the channel region; and
a top conductive layer above the multilayer stack and above the channel region.

9. The method of claim 8, wherein the charge trapping dielectric layer is an only charge trapping layer in the multilayer stack.

10. The method of claim 1, wherein the program and erase operations on the nonvolatile memory cell change the second charge density on the charge trapping dielectric layer in the nonvolatile memory cell by no more than 50%.

11. The method of claim 1, further comprising:
performing an additional program operation on the nonvolatile memory cell that changes the second charge density on the charge trapping dielectric layer, by applying a second program bias arrangement having a second program voltage magnitude larger than a first program voltage magnitude of the program operations.

12. The method of claim 1, further comprising:
performing an additional program operation on the nonvolatile memory cell that changes the second charge density on the charge trapping dielectric layer, by applying a second program bias arrangement having a second program duration longer than a first program duration of the program operations.

13. The method of claim 1, further comprising:
performing an additional erase operation on the nonvolatile memory cell that changes the second charge density on the charge trapping dielectric layer, by applying a second erase bias arrangement having a second erase voltage magnitude larger than a first erase voltage magnitude of the erase operations.

14. The method of claim 1, further comprising:
performing an additional erase operation on the nonvolatile memory cell that changes the second charge density on the charge trapping dielectric layer, by applying a second erase bias arrangement having a second erase duration longer than a first erase duration of the erase operations.

15. A nonvolatile memory cell comprising:
a semiconductor substrate having a surface with a source region and a drain region in the substrate and separated by a channel region;
a multilayer stack over the channel region including a first tunneling barrier structure disposed on the surface of the substrate above the channel region, a floating gate disposed above the first tunneling barrier structure and above the channel region, and a charge trapping dielectric layer above the floating gate and above the channel region the floating gate and the charge trapping dielectric both planar; and
a top conductive layer above the multilayer stack and above the channel region;
circuitry controlling program and erase operations on the nonvolatile memory cell, by changing a first charge density on a floating gate in the nonvolatile memory cell by a larger magnitude than a second charge density on a charge trapping dielectric layer in the nonvolatile memory cell.

16. The nonvolatile memory cell of claim 15, wherein the program operations controlled by the circuitry raise a threshold voltage of the nonvolatile memory cell by changing the first charge density to become more negative from a net positive charge density value.

17. The nonvolatile memory cell of claim 15, wherein the erase operations controlled by the circuitry lower a threshold voltage of the nonvolatile memory cell by changing the first charge density to become more positive to a net positive charge density value.

18. The nonvolatile memory cell of claim 15, wherein the nonvolatile memory cell has an initial state preceding any of the program and erase operations, and the circuitry controls an initial program operation preceding any of the program and erase operations that changes the initial state such that the charge trapping dielectric layer has the second charge density.

19. The nonvolatile memory cell of claim 15, wherein the nonvolatile memory cell has an initial state preceding any of the program and erase operations, and the circuitry controls an initial erase operation preceding any of the program and erase operations that changes the initial state such that the charge trapping dielectric layer has the second charge density.

20. The nonvolatile memory cell of claim 15, wherein the nonvolatile memory cell has an initial state preceding any of the program and erase operations, and the circuitry controls an initial program operation preceding any of the program and erase operations that results in a negative charge density on the charge trapping dielectric layer and a nonnegative charge density on the floating gate.

21. The nonvolatile memory cell of claim 15, wherein the nonvolatile memory cell has an initial state preceding any of the program and erase operations, and the circuitry controls an initial erase operation preceding any of the program and erase operations that results in a negative charge density on the charge trapping dielectric layer and a positive charge density on the floating gate.

22. The nonvolatile memory cell of claim 15, wherein the charge trapping dielectric layer is an only charge trapping layer in the multilayer stack.

\* \* \* \* \*